United States Patent
Dupont et al.

(10) Patent No.: US 11,277,148 B2
(45) Date of Patent: Mar. 15, 2022

(54) DOUBLE-PASS LEMPEL-ZIV DATA COMPRESSION WITH AUTOMATIC SELECTION OF STATIC ENCODING TREES AND PREFIX DICTIONARIES

(71) Applicant: Cyborg Inc., New York, NY (US)

(72) Inventors: Nicolas Thomas Mathieu Dupont, New York, NY (US); Alexandre Helle, Forest Hills, NY (US); Glenn Lawrence Cash, Matawan, NJ (US); Alicja Texler, Brooklyn, NY (US)

(73) Assignee: Cyborg Inc., New York, NY (US)

( * ) Notice: Subject to any disclaimer, the term of this patent is extended or adjusted under 35 U.S.C. 154(b) by 0 days.

(21) Appl. No.: 17/382,015

(22) Filed: Jul. 21, 2021

(65) Prior Publication Data

US 2022/0038113 A1    Feb. 3, 2022

Related U.S. Application Data

(60) Provisional application No. 63/056,160, filed on Jul. 24, 2020.

(51) Int. Cl.
    *H03M 7/30*    (2006.01)
    *H03M 7/40*    (2006.01)
    *G06F 16/174*  (2019.01)

(52) U.S. Cl.
    CPC ........ *H03M 7/3084* (2013.01); *H03M 7/405* (2013.01); *H03M 7/6011* (2013.01); *G06F 16/1744* (2019.01)

(58) Field of Classification Search
    CPC .. H03M 7/3084; H03M 7/405; H03M 7/6011; G06F 16/1744
    USPC .............................. 341/50–51, 65, 87
    See application file for complete search history.

(56) References Cited

U.S. PATENT DOCUMENTS

| | | | |
|---|---|---|---|
| 2019/0065494 A1* | 2/2019 | Abali | G06F 16/90344 |
| 2019/0123763 A1* | 4/2019 | Bissessur | H03M 7/3084 |
| 2020/0162101 A1 | 5/2020 | Beckman et al. | |

FOREIGN PATENT DOCUMENTS

WO    WO-2014145363 A2    9/2014

OTHER PUBLICATIONS

International Search Report and Written Opinion for International Application No. PCT/US2021/042927, dated Dec. 22, 2021, 15 pages.

\* cited by examiner

*Primary Examiner* — Khai M Nguyen
(74) *Attorney, Agent, or Firm* — Cooley LLP

(57) ABSTRACT

A method includes receiving an input data stream at a processor, and for each byte sequence from a plurality of byte sequences of the input data stream, a hash is generated and compared to a hash table to determine whether a match exists. If a match exists, that byte sequence is incrementally expanded to include one or more additional adjacent bytes from the input data stream, to produce multiple expanded byte sequences. Each of the expanded byte sequences is compared to the hash table to identify a maximum-length matched byte sequence from a set that includes the byte sequence and the plurality of expanded byte sequences. A representation of the maximum-length matched byte sequence is stored in the memory. If a match does not exist, a representation of that byte sequence is stored as a byte sequence literal in the memory.

20 Claims, 11 Drawing Sheets

US 11,277,148 B2

DOUBLE-PASS LEMPEL-ZIV DATA COMPRESSION WITH AUTOMATIC SELECTION OF STATIC ENCODING TREES AND PREFIX DICTIONARIES

CROSS-REFERENCE TO RELATED APPLICATIONS

This application claims the benefit of U.S. Provisional Patent Application No. 63/056,160, filed Jul. 24, 2020 and titled "Double-Pass Lempel-Ziv Data Compression with Automatic Selection of Static Encoding Trees and Prefix Dictionaries," the entirety of which is incorporated by reference herein in its entirety.

FIELD

The present disclosure relates to systems and methods for compressing data in a lossless manner, with particular improvements in compression and decompression performance across a range of data.

BACKGROUND

The process of reducing the size of a data file is often referred to as data compression. Data compression involves encoding information using fewer bits than the original representation, and can be lossless or lossy.

SUMMARY

Systems and methods for encoding and decoding data are described. In addition, systems and methods for performing searches on compressed data, without decompressing the data, are described. Example features, structure and operation of various embodiments are described in detail below with reference to the accompanying drawings.

In some embodiments, a method includes receiving an input data stream at a processor. For each byte sequence from a plurality of byte sequences of the input data stream, a hash of that byte sequence is generated by the processor. The hash is compared, via the processor, to a hash table to determine whether a match exists. The hash table is stored in a memory operably coupled to the processor. If a match exists, that byte sequence is incrementally expanded, via the processor, to include one or more additional adjacent bytes from the input data stream, to produce a plurality of expanded byte sequences. Each expanded byte sequence from the plurality of expanded byte sequences is compared, via the processor, to the hash table to identify a maximum-length matched byte sequence from a set that includes the byte sequence and the plurality of expanded byte sequences, and a representation of the maximum-length matched byte sequence is stored in the memory. If a match does not exist, a representation of that byte sequence is stored as a byte sequence literal in the memory.

In some embodiments, a system includes a processor and a memory that is operably coupled to the processor and that stores instructions that, when executed by the processor, cause the processor to perform a method. The method includes, for each byte sequence from a plurality of byte sequences of an input data stream, generating a hash of that byte sequence and comparing the hash to a hash table to determine whether a match exists. The hash table is stored in a memory operably coupled to the processor. If a match exists, that byte sequence is incrementally expanded to include one or more additional adjacent bytes from the input data stream, to produce a plurality of expanded byte sequences. Each expanded byte sequence from the plurality of expanded byte sequences is compared to the hash table to identify a maximum-length matched byte sequence from a set that includes the byte sequence and the plurality of expanded byte sequences. A representation of the maximum-length matched byte sequence is stored in the memory. If a match does not exist, a representation of that byte sequence is stored as a byte sequence literal in the memory.

In some embodiments, a non-transitory, processor-readable medium stores instructions to perform a method. The method includes, for each byte sequence from a plurality of byte sequences of an input data stream, generating a hash of that byte sequence and comparing the hash to a hash table to determine whether a match exists. The hash table is stored in a memory operably coupled to the processor. If a match exists, that byte sequence is incrementally expanded to include one or more additional adjacent bytes from the input data stream, to produce a plurality of expanded byte sequences. Each expanded byte sequence from the plurality of expanded byte sequences is compared to the hash table to identify a maximum-length matched byte sequence from a set that includes the byte sequence and the plurality of expanded byte sequences. A representation of the maximum-length matched byte sequence is caused to be stored in the memory. If a match does not exist, a representation of that byte sequence as a byte sequence literal is caused to be stored in the memory.

In some embodiments, a method includes receiving, at a processor, an input bit stream, and generating, via the processor and for each byte sequence from a plurality of byte sequences of the input data stream, a hash of that byte sequence, to define a plurality of hashes. The method also includes storing, in a memory operably coupled to the processor, an array that includes (1) a plurality of positions, each position from the plurality of positions being a position within the input data stream of a hash from the plurality of hashes, and (2) a last observed position of each hash from the plurality of hashes. The method also includes identifying, via the processor, a plurality of potential matches between the plurality of byte sequences and a hash table based on the array, and calculating a score, from a plurality of scores, for each potential match from the plurality of potential matches. A subset of potential matches is selected from the plurality of potential matches, based on the plurality of scores, and a representation of the selected subset of potential matches is stored in the memory.

In some embodiments, a system includes a processor and a memory, operably coupled to the processor and storing instructions that, when executed by the processor, cause the processor to perform a method. The method includes generating, for each byte sequence from a plurality of byte sequences of the input data stream, a hash of that byte sequence, to define a plurality of hashes. The method also includes storing, in the memory, an array that includes (1) a plurality of positions, each position from the plurality of positions being a position within the input data stream of a hash from the plurality of hashes, and (2) a last observed position of each hash from the plurality of hashes. The method also includes identifying a plurality of potential matches between the plurality of byte sequences and a hash table based on the array, and calculating a score, from a plurality of scores, for each potential match from the plurality of potential matches. The method also includes selecting a subset of potential matches from the plurality of potential matches, based on the plurality of scores, and storing a representation of the selected subset of potential matches in the memory.

In some embodiments, a method includes generating, via a processor and for each byte sequence from a plurality of byte sequences of an input data stream, a hash of that byte sequence, to define a plurality of hashes. The method also includes comparing each hash from the plurality of hashes to a hash table to identify a plurality of matched hashes associated with a first subset of byte sequences from the plurality of byte sequences, a second subset of byte sequences from the plurality of byte sequences including byte sequences that are not associated with a matched hash from the plurality of matched hashes. The method also includes selecting a static Huffman tree to encode the second subset of byte sequences, based on a predefined encoding strategy, and calculating an entropy associated with the selected static Huffman tree. The method also includes calculating a result size associated with the selected static Huffman tree, based on the entropy, and determining whether the result size is within a predefined percentage of a number of byte sequences in the second subset of byte sequences. If the result size is within the predefined percentage of the number of byte sequences in the second subset of byte sequences, an encoding type is set to static encoding. If the result size is not within the predefined percentage of the number of byte sequences in the second subset of byte sequences, the number of byte sequences in the second subset of byte sequences is less than a predefined first threshold value, and the result size is less than the predefined first threshold value, the encoding type is set to an encoding procedure that is performed based on an inverted index array and a rank table. If the result size is not within the predefined percentage of the number of byte sequences in the second subset of byte sequences, and if at least one of: (1) the number of byte sequences in the second subset of byte sequences is not less than the predefined first threshold value, or (2) the result size is not less than the predefined first threshold value: a custom prefix is generated and compared to the selected static Huffman tree. If the custom prefix is preferable to the selected static Huffman tree, the encoding type is set to custom, and if the custom prefix is not preferable to the selected static Huffman tree, set the encoding type to static encoding.

In some embodiments, a method includes identifying, via a processor, a first subset of an input data and a second subset of the input data. A Huffman tree is selected, via the processor and from a plurality of Huffman trees, based on a predefined encoding level, and the first subset of the input data is encoded using the selected Huffman tree. A frequency curve is generated for the second subset of the input data, using one of (1) a Riemann Sum or (2) a triple lookup table having a plurality of accuracies, and the second subset of the input data is encoded based on the frequency curve.

DETAILED DESCRIPTION

Figure 1:
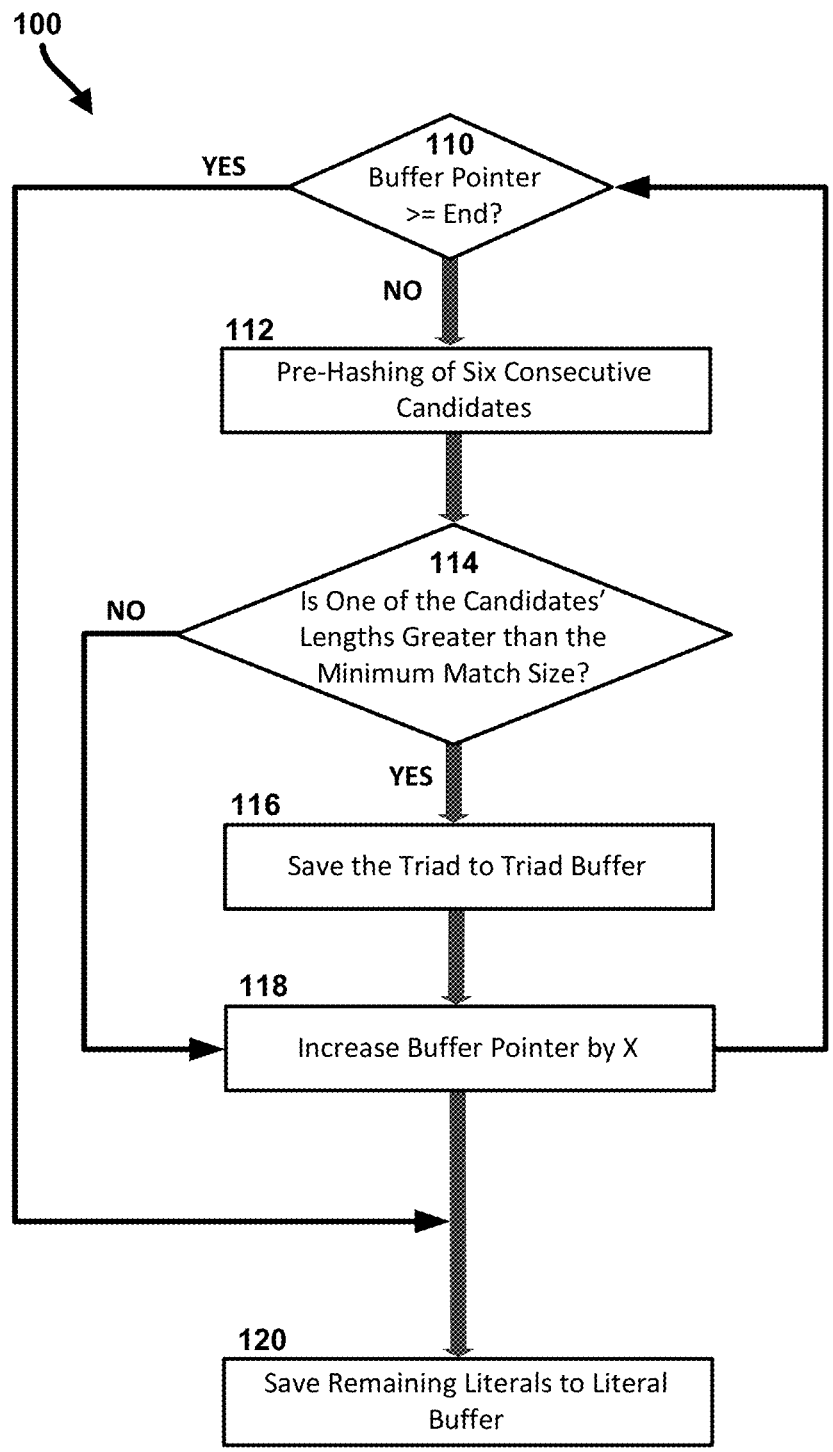
FIG. 1 is a flow diagram showing a fast_search_match_multi_XH( ) procedure according to some embodiments.

As the availability of storage capacity and network bandwidth increases, the desirability of new and useful data compression techniques also increases. Data compression techniques can generally be divided into two major categories: lossy and lossless. Lossless data compression techniques are typically employed when it is particularly important that no information is lost during the compression/decompression process. Lossy data compression techniques are typically employed in processing applications such as the transmission and storage of digital video and audio data that can tolerate some information loss (e.g., since human vision is forgiving of potential artifacts). Lossy data compression techniques typically yield greater compression ratios than their lossless counterparts. Over the past 30 years, lossy data compression methods have gained tremendous importance for their use in video conferencing/streaming to a wide variety of devices, and home entertainment systems. Most other applications employ lossless data compression techniques.

For applications using data types such as video, it is possible to achieve compression ratios of 150:1 for Quarter Common Intermediate Format (QCIF) @15 fps over 64 Kbps (typically used in wireless video telephony applications) or 1080P High Definition (HD) @60 fps at 20 Mbps over broadband networks. These applications typically use the modern International Telecommunication Union (ITU) H.264 video compression standard, resulting in high quality video. However, for data types/files such as documents, spreadsheets, SQL files, etc., lossless data compression is generally strongly preferred. Compression ratios for lossless methods are typically much lower than those for lossy methods. For example, lossless compression ratios can range from 1.5:1 for arbitrary binary data files, to 3.0:1 for files such as text documents, in which there is substantially more redundancy.

Transmitting compressed data takes less time than transmitting the same data without first compressing it. In addition, compressed data uses less storage space than uncompressed data. Thus, for a device with a given storage capacity, more files can be stored on the device if the files are compressed. As such, two of the primary advantages for compressing data are increased storage capacity and decreased transmission time.

Embodiments of the present disclosure set forth novel methods for accomplishing data compression in lossless and/or lossy contexts. When a parsing quality of a data compression technique is higher, the compression ratio is typically also higher, however increasing the parsing quality can also result in a slower process. In view of this trade-off, multiple different embodiments of encoders (and associated methods) are presented herein.

LZ Modeling

In some embodiments, an encoder is part of a "Lempel-Ziv" ("LZ")-modeled encoder family. LZ modeling makes it possible for the encoder/compressor to identify byte sequences that are similar to one another within an input bit stream. The identified similar byte sequences can, in turn, be used to compress the data of the input bit stream. For example, the first time that a given byte sequence appears within the input bit stream, the LZ modeling function may identify that byte sequence as a "literal byte" sequence. Subsequently, whenever the same byte sequence occurs, the LZ modeling function can identify that byte sequence as a "match." The foregoing process is referred to herein as "parsing" the data. As discussed above, when the parsing quality is higher, the compression ratio is typically also higher, however increasing the parsing quality can also result in a slower process. In view of this trade-off, multiple different embodiments of encoders (and associated methods) are presented herein, ranging from encoders having a fastest compression, to encoders having a slowest compression but a highest compression ratio. The encoder embodiments set forth herein leverage modern processor architectures, while innovating the manner in which data is parsed, for example using different numbers of passes based on the parsing quality selected.

In some embodiments, LZ modeling is performed on the encoder but not on the associated decoder, and the quality of the parsing used on the encoder does not affect the decoder speed.

Single-Pass Modeling

In some embodiments, a processor-implemented encoder employs one-pass modeling, or single-pass modeling (SPM), operated by the function fast_search_match_multi_XH( ), and exhibits the fastest parsing of the encoders described herein. SPM includes creating a hash table to check and store the positions of each byte sequence in an input bit stream. Each instance of a byte sequence having a same hash value as a previously observed instance of the byte sequence is used to overwrite that previously observed instance. A size of the byte sequences can be, for example, four bytes or six bytes, and may be determined by a size of the input bit stream. In some implementations, a size of the hash table is relatively large (e.g., 64 kilobytes (KB)), e.g., to reduce the likelihood of collisions.

The following code illustrates a process to hash a single byte sequence, according to some embodiments:

//Hash a sequence of 4 bytes
uint16_t hash_value=hash4B(new_position);
//Get the previous position
previous_position=hash_table[hash_value];
//Update the position in the hash table
hash_table[hash_value]=new_position;

In some embodiments, to leverage modern x86 architectures, SPM hashes four candidate byte sequences at a time (i.e., concurrently) before checking for a match against the hash table. This allows the processor to perform the comparisons Out-of-Order (OoO) and feed the pipeline. The following code illustrates a process to hash four consecutive candidate byte sequences, according to some embodiments:

//Hash 4 consecutive sequences of 4 bytes and store the position of the
//candidate
candidate[0]=pre_hash_4B(&length[0], hash_table, ip, begin, 0);
candidate[1]=pre_hash_4B(&length[1], hash_table, ip, begin, 1);
candidate[2]=pre_hash_4B(&length[2], hash_table, ip, begin, 2);
candidate[3]=pre_hash_4B(&length[3], hash_table, ip, begin, 3);

The hashes of the four candidate byte sequences are then sequentially compared to the hash table to attempt to identify a match. If a match is found, a function match_length_unlimited( ) is called and used to attempt to expand the size of the matching byte sequence in a forward direction within the input bit stream (e.g., incrementally expanding the byte sequence to include bits or bytes occurring subsequent to the byte sequence within the input bit stream). To obtain the size of a match, a De Bruijn sequence can be used, which allows a fast comparison of two byte sequences and returns the size of their common substring. Depending on the desired quality level, a match also can be expanded in a backward/reverse direction within the input bit stream (e.g., incrementally expanding the byte sequence to include bits or bytes preceding the byte sequence within the input bit stream) by the function LZsearch_backward( ). To store the match, a function save_triad_unlimited( ) is called. In some implementations, only the first match identified is stored, and the three other matches may be used as potential matches for future byte sequences, thereby improving the overall compression ratio of the encoder. If no matches are found among the four candidate byte sequences, the byte sequences may be stored (e.g., in a separate buffer) as byte literals.

A match can be represented by a structure that includes the following three variables, collectively referred to herein as a "triad":

Length: the size of the byte sub string returned by the De Bruijn technique+optional backward expansion Offset: the distance between the matching byte sequence and the current byte sequence Number of literals: the number of byte literals between the match found and the previous match, within the bit stream Example code illustrating the storage of the triad is as follows:

/*stealth_triad_t: LZ triad storage*/
typedef struct {
//Distance from the match
uint32_t offset;
//Match length storage;
uint8_t length;
//Number of literal before the match
uint8_t nb_literal;
} stealth_triad;

In some embodiments, the foregoing process is repeated until an end of the input bit stream is reached, at which time the SPM returns the literal buffer and the triad buffer to be encoded (see "Byte Literal Encoding" and "Triad Encoding" sections, below).

The offset portion of the triad is stored as a 32-bit integer, pre-encoded as shown below (e.g., for faster retrieval), while the length and number of literals are respectively stored as 8-bit integers.

//Save it
*storage=(uint32_t)(offset|(uint32_t)reduced<<20|
  (uint32_t)acc<<28);

| Accuracy identification | Reduced offset | Actual offset |
|---|---|---|
| 4 bits | 8 bits (up to 256) | 20 bits (up to 2^20 − 1) |

FIG. 1 is a flow diagram showing an example fast_search_match_multi_XH( ) procedure 100, with pre-hashing of six consecutive byte string candidates, according to some embodiments. As shown in FIG. 1, the fast_search_match_ multi_XH( ) procedure 100, implemented by a processor executing processor-executable instructions stored in a memory operably coupled to the processor, begins with checking, at 110, whether a buffer pointer is greater than or equal to an end bit/position of an input bit stream. If the buffer pointer is not greater than or equal to an end of an input bit stream, the fast_search_match_multi_XH( ) procedure 100 proceeds by pre-hashing, at 112, six consecutive candidate byte strings, and then determining, at 114, whether one of the six consecutive candidate byte strings has a length that is greater than a minimum match size. If, at 114, it is determined that one of the six consecutive candidate byte strings has a length that is greater than a minimum match size, a triad is generated for that byte string (not shown) and the triad is saved in a triad buffer (e.g., of the memory) at 116. At 118, the buffer pointer is incremented, and the fast_search_match_multi_XH( ) procedure 100 loops back to step 110. If, at 114, it is determined that none of the six consecutive candidate byte strings has a length that is greater than a minimum match size, the fast_search_match_multi_XH( ) procedure 100 proceeds to increment the buffer pointer, at 118, and loops back to step 110. In addition, remaining literals from the six consecutive byte string candidates are saved to a literal buffer, at 120. At any stage of the fast_search_match_multi_XH( ) procedure 100, if the processor determines at 110 that the buffer pointer is greater than or equal to an end bit/position of the input bit stream, the fast_search_match_multi_XH( ) procedure 100 proceeds to save the remaining literals to the literal buffer, at 120.

Double-Pass Modeling

In some embodiments, a processor-implemented encoder employs two-pass modeling, or "double-pass modeling" ("DPM"), implemented by calling a function model_chain ( ), which is an adaptive modeling technique that can accommodate multiple different parsing quality levels, and uses Markov chain compression to store potential matches, leveraging modern processor architectures. A first pass of DPM includes creating a chain buffer (or "buffer road" or "buffer road map") based on the Markov chain and the SPM pre-hash approach described above, while a second pass of DPM scores and selects the best estimated matches to be encoded.

The first pass is processed through a function create_buffer_road_map( ), which hashes four byte sequences at a time, following the SPM pre-hash technique, and stores the positions of the sequences in a separate array, following the Markov chain, by storing the last observed position of the same hash value at the current position. As such, a first position having the same hash value as a second position is linked to the second position by containing a reference to the second position.

//Link two positions of the same hash value,
buffer_road_map[current_pos]=previous_pos;

The buffer road size is the size of the input bit stream (e.g., up to 128 KB ($2^{17}$)), and the first pass is completed once the entire input bit stream has been hashed and processed. At the end of the first pass, the hash table can be deallocated (i.e., the contents of the hash table can be cleared) as all the potential match positions are stored in the buffer road. Subsequent modeling is based on the chain (i.e., the "separate array" referenced above), the input bit stream only being accessed again if an expansion of a match is desired, which can serve to reduce cache misses.

During the second pass, searches for potential matches are performed using the buffer road, the potential matches are scored, and the best matches are selected. Searches of the buffer road are efficient since every position is linked to a position of a next match candidate. The variable check_chain refers to a number of searches performed in the chain, and can be defined by a desired parsing quality. Given that a match can overlap another match, several steps forward in the input bit stream defined by a variable check_depth may be taken (i.e., several additional bits, in a forward direction of the input bit stream, may be considered) to ensure that a preferable match is not overlooked/missed. For each step taken forward in the input bit stream, a same amount of checks (check_chain) may be performed in the chain. The number of steps taken forward in the input bit stream can be defined by the desired parsing quality.

Below is example pseudocode for a guess_best_match( ) subroutine (also referred to herein as a "scoring function"), which returns a best potential match:

```
// Get best match
for (depth = 0; depth < check_depth; depth++)
    for (check_id = 0; check_id < check_chain; check_id++) {
        // Get current score
        score = get_match_score (positions, input + depth);
        position = buffer_road[position];
        if (score > best_score)
            save_triad_unlimited ( );
    }
```

Figure 2:
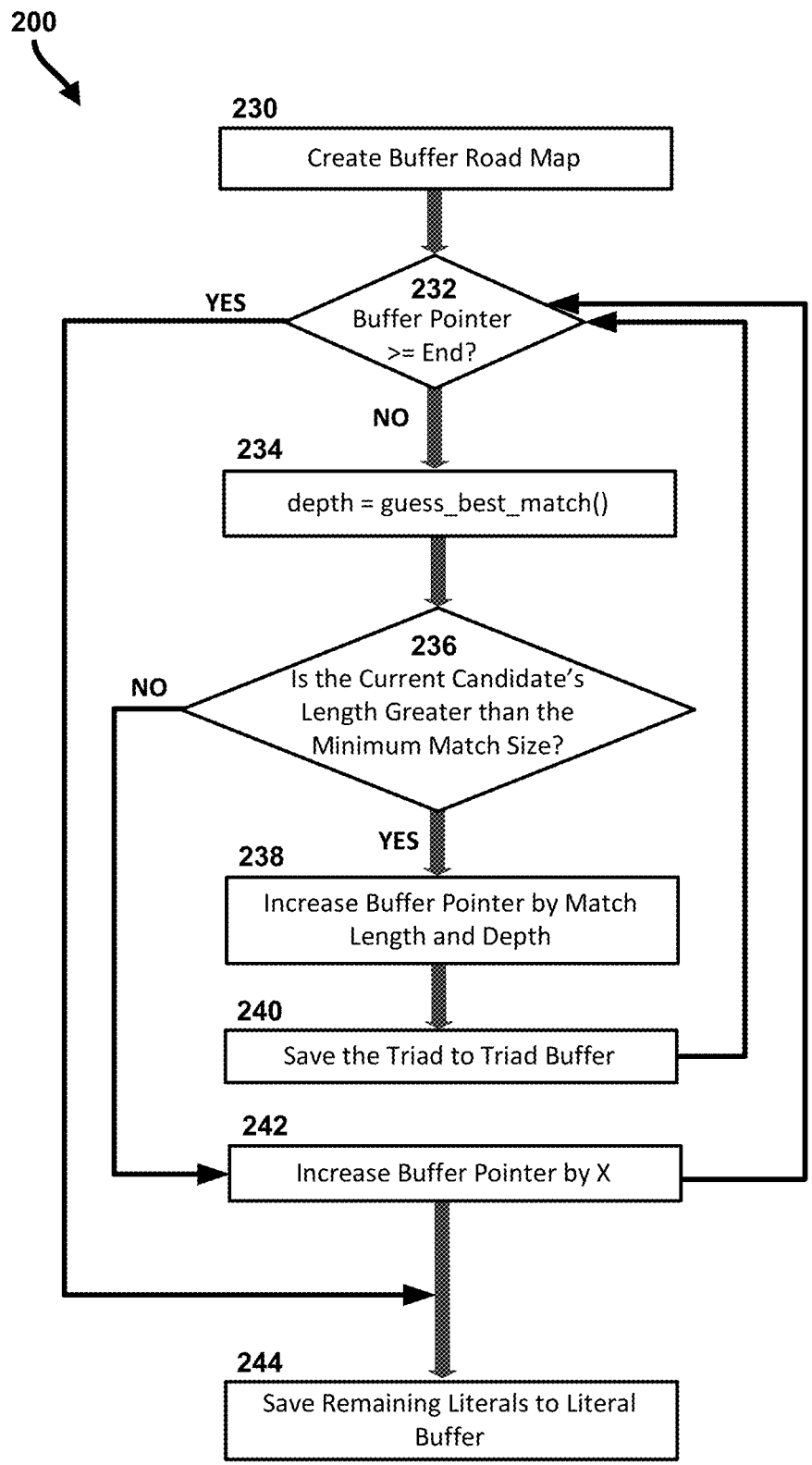
FIG. 2 is a flow diagram showing a model_chain( ) procedure according to some embodiments.

FIG. 2 is a flow diagram showing a model_chain( ) procedure 200 according to some embodiments. As shown in FIG. 2, the model_chain( ) procedure 200, implemented by a processor executing processor-executable instructions stored in a memory operably coupled to the processor, begins with the creation, at 230, of a buffer road map. At 232, a check is performed as to whether a buffer pointer is greater than or equal to an end bit/position of an input bit stream. If, at 232, the buffer pointer is not greater than or equal to an end bit/position of an input bit stream, the model_chain( ) procedure 200 proceeds by determining, at 234, a depth of a best potential match, using the guess_best_match( ) scoring function. The "depth" of the best potential match is the number of bytes that were not matches between the last match and the current match. A byte string beginning at the buffer pointer and having the depth of the best potential match is identified as being a current candidate byte string. At 236, a determination is made as to whether the current candidate byte string's length is greater than a minimum match size. If the processor determines, at 236, that the current candidate byte string's length is greater than the minimum match size, the model_chain( ) procedure 200 proceeds to increase the buffer pointer, at 238, by the match length and depth. A triad is then generated for the current candidate byte string (not shown) and the triad is saved in a triad buffer (e.g., of the memory) at 240. The model_chain( ) procedure 200 then loops back to the step at 232 of evaluating the buffer pointer relative to the end bit/position of the input bit stream. If the processor determines, at 236, that the current candidate byte string's length is not greater than the minimum match size, the model_chain( ) procedure 200 proceeds to increase the buffer pointer, at 242, by a value "X." The remaining literals are saved, at 244, to a literal buffer, and loops back to the step at 232 of evaluating the buffer pointer relative to the end bit/position of the input bit stream. If, at 232, the buffer pointer is greater than or equal to the end bit/position of the input bit stream, the model_chain( ) procedure 200 also proceeds by saving the remaining literals (if any) at 244.

Byte Literal Encoding

Encoding Strategy Selection

In some embodiments, prior to encoding a literal buffer, an encoding strategy is selected, for example using a strategy_literal( ) function. Depending on the desired compression level (e.g., a desired quality of parsing and/or speed of parsing), one or more different heuristics, e.g., implemented by a static encoding (or Huffman) tree selector implemented in code stored in memory and executed by a processor operably coupled to the memory, can be used for selecting an appropriate (or "best") static Huffman tree, from a set of available Huffman trees, for subsequent comparison with a custom prefix-free tree previously generated for the literals in the literal buffer.

In some embodiments, selecting the encoding strategy includes counting frequencies of occurrence of characters in the literal buffer. A function get_freqs_from_buffer( ), which counts the characters using an unrolled loop, can be used for this purpose.

Depending on the selected encoding level, the static tree selector can use, for example, principal component analysis (PCA) or a cross-entropy heuristic to determine the best static Huffman tree. PCA may be selected, for example, when faster compression is desired, while cross-entropy may be selected, for example, when a desired accuracy in the compression is prioritized over speed of compression.

The functions get_best_tree_pca_entropy( ) and get_best_tree_x_entropy( ), for example, can return a static tree index, and a size of the result of compression using the best chosen Huffman tree can be provided in the parameters passed by reference.

In a next step, an entropy of the literal buffer can be calculated, for example using a function get_file_entropy( ), which uses $\log_2$ for the precise calculation of the entropy. The preferred prefix result size is then calculated based on the entropy percentage. The selected prefix result size can account for (i.e., include sufficient capacity for) the size of the custom prefix that would be saved in a header by including a constant value for the custom prefix (e.g., a CUSTOM_PREFIX_SIZE constant) as part of the selected prefix result size.

In some embodiments, if a calculated difference in predicted size between the static tree size and the preferred prefix tree falls within a predefined threshold percentage of the number of literals in the literal buffer (e.g., set to 1.5% of the number of literals), and the static tree would not expand the literals buffer, static encoding may be selected, in which case the static tree is copied to the literal lookup table (LUT).

If the static tree appears to be worse than (e.g., less compressed than) the preferred prefix, the number of literals in the literal buffer is less than a predefined value (e.g., a BUBBLE_SIZE value, for example set to 2,000), and a calculated difference in predicted size between the static tree size and the selected prefix tree is still relatively small (e.g., not more than double the predefined threshold), a bubble-up encoder may be selected.

If the number of literals in the literal buffer is greater than the predefined value (e.g., BUBBLE_SIZE) and/or the calculated difference in predicted size between the static tree size and the selected prefix tree is greater than the predefined threshold, a custom canonical prefix may be generated, with a codeword length limited to 11 bits. Since the codeword length is limited, the custom canonical prefix may exhibit a reduced compression ratio. As such, the result size for the custom canonical prefix may be compared with the result size for the static tree, and the custom canonical prefix may be selected if it will produce a result having fewer bits than the static tree.

Figure 3:
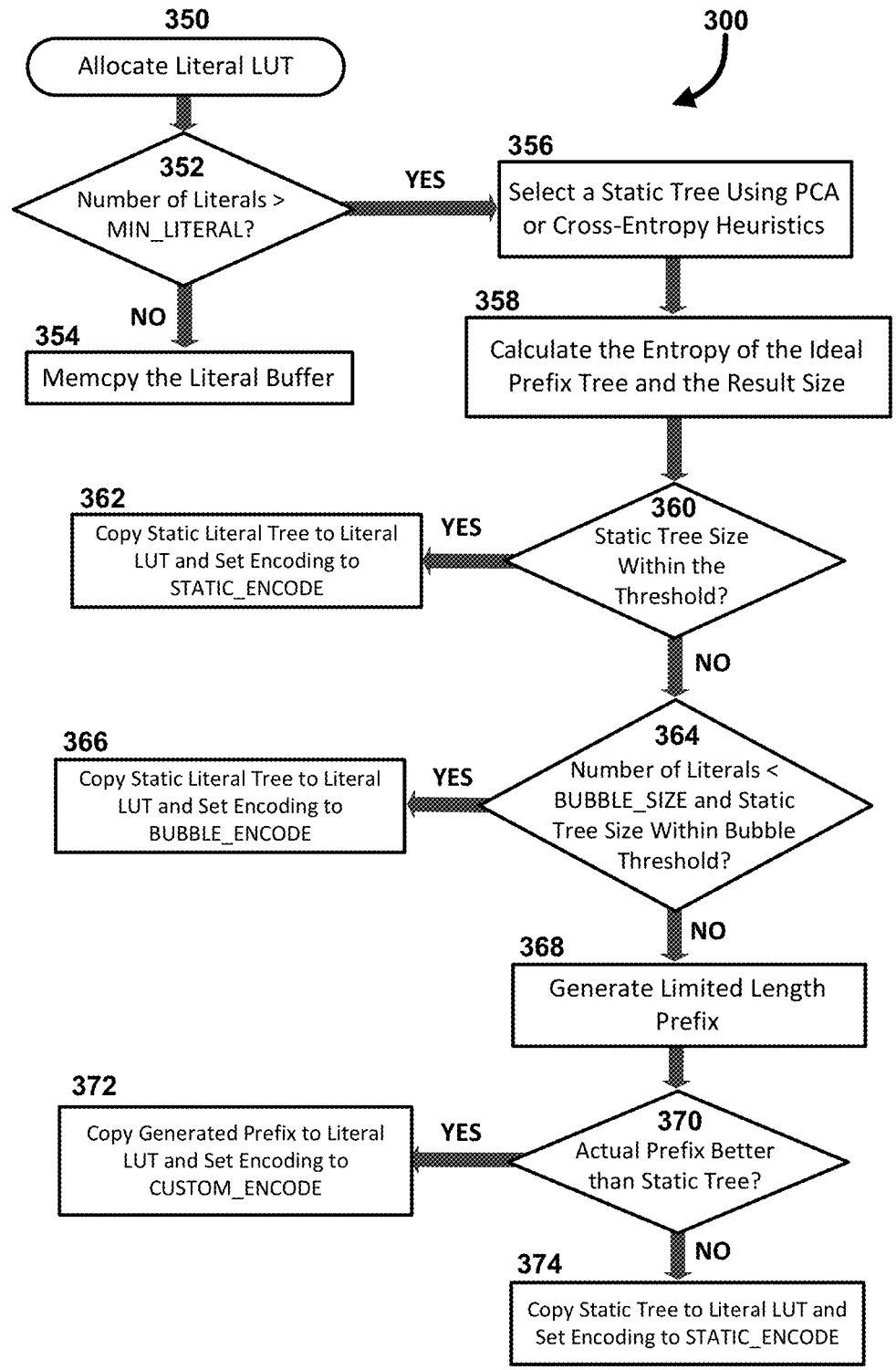
FIG. 3 is a flow diagram showing a strategy)literal( ) procedure according to some embodiments.

FIG. 3 is a flow diagram showing a strategy_literal( ) procedure 300 according to some embodiments. As shown in FIG. 3, the strategy_literal( ) procedure 300, implemented by a processor executing processor-executable instructions stored in a memory operably coupled to the processor, begins with allocating a literal LUT, at 350, and determining, at 352, whether a number of literals in a literal buffer is greater than a predefined number ("MIN LITERAL"). If the processor determines, at 352, that the number of literals in a literal buffer is not greater than MIN LITERAL, the literal buffer is copied to the output buffer at 354. If the processor determines, at 352, that the number of literals in a literal buffer is greater than MIN LITERAL, the strategy_literal( ) procedure 300 proceeds to selecting a static tree, at 356, using a heuristic such as PCA or cross-entropy. An entropy of the selected static tree and an associated result size (i.e., the size of the literals if they would be compressed using the selected static tree) are calculated, at 358, and determination is made, at 360, as to whether the calculated static tree size is within a predetermined threshold percentage of the number of literals in the literal buffer. If the processor determines, at 360, that the calculated static tree size is within the predetermined threshold percentage of the number of literals in the literal buffer, the static tree is copied, at 362, to the literal LUT and an encoding type is set to static encoding ("STATIC_ENCODE"). If the processor determines, at 360, that the calculated static tree size is not within the predetermined threshold percentage of the number of literals in the literal buffer, determinations are made at 364 as to (1) whether the number of literals in the literal buffer is less than a predefined BUBBLE_SIZE value/threshold, and (2) whether the static tree size is within the BUBBLE_SIZE value/threshold. If the processor determines, at 364, that the number of literals in the literal buffer is less than a predefined BUBBLE_SIZE value/threshold, and the static tree size is within the BUBBLE_SIZE value/threshold, the static tree is copied, at 366, to the literal LUT and the encoding type is set to bubble encoding ("BUBBLE_ENCODE"). If the processor determines, at 364, that the number of literals in the literal buffer is not less than a predefined BUBBLE_SIZE value/threshold, and/or the static tree size is not within the BUBBLE_SIZE value/threshold, a limited length prefix (also referred to herein as a "custom canonical prefix") is generated at 368. At 370, the processor evaluated whether the actual prefix is preferable than the static tree. If so, the generated prefix is copied to the literal LUT, at 372, and the encoding type is set to custom encoding ("CUSTOM_ENCODE").

Cross-Entropy Heuristic

As discussed above, in some embodiments, a cross-entropy heuristic is used for the selection of static trees for the compression of byte sequences and/or buffers. When compressing a literal buffer, for example, a set of 256 distinct frequencies for each 8-bit character can viewed or used as a probability distribution.

In general, cross entropy is calculated by using the following formula:

$$H(P, Q) = -\sum_{x \in X} p(x) \cdot \log(q(x))$$

Where p(x) is a current probability distribution, q(x) is a probability distribution to which p(x) is compared, and H(P, Q) refers to the cross entropy of variable P and variable Q. The formula below describes the relationship between cross-entropy and Kullback-Leibler divergence:

$$D_{KL}(P\|Q) = -\sum_{x \in X} p(x)\log q(x) + \sum_{x \in X} p(x)\log q(x) = H(P, Q) - H(P)$$

where H(P) is the entropy of P (which is the same as cross-entropy of P with itself).

In statistics, the Kullback-Leibler divergence is a measure of how a first probability distribution is different from a second probability distribution. As discussed above, the set of frequencies of symbols in the literal buffer can represent a probability distribution for the occurrence of a symbol in a buffer. In the case of compression, the Kullback-Leibler divergence can be used to represent the difference between an average codelength of a given static tree, and an average codelength of a preferred tree for the given set of symbol frequencies. As used herein, "codelength" refers to the length of encoding of a byte symbol, in bits (or, an "average codeword length").

For a given encoding $L=\{l_1, l_2, \ldots, l_n\}$ and set of symbol frequencies $P=\{p_1, p_2, \ldots p_n\}$, an average codelength can be expressed by the following formula:

$$L = \sum_i p_i \cdot l_i$$

This average codelength for a Huffman code may approach an optimal codelength. When the codelengths for a given static tree are known, the cross-entropy can be expressed as a function of codelength, to obtain the following formula:

$$H(P, Q) = \sum_i p_i \cdot l_{qi}$$

where $l_{qi}$ represents length of the i-th symbol in the static tree with distribution q. Consequently, Kullback-Leibler divergence is represented as:

$$D_{KL}(P\|Q) = \sum_i p_i \cdot l_i - \sum_i p_i \cdot \log(p_i)$$

To reduce the number of calculations, sizes of compressed literal buffers for a given static tree may be calculated, since the smallest size represents the smallest cross-entropy. A function get_best_tree_x_entropy( ), for example, can call a function calculate_file_size( ), and then select the best static tree using a for-loop. Example function code is as follows:

```
uint8_t get_best_tree_x_entropy(uint32_t current_freqs
[ALPHABET_SIZE],
                                 uint64_t file_size,
                                 uint64_t* best_result_size) {
  uint64_t filesizes[TREES_NUMBER] = { 0 };
  get_file_sizes(current_freqs, filesizes, TREES_NUMBER);
  uint64_t min_size = filesizes[0];
```

-continued

```
  uint8_t index = 0;
  for (int i = 1; i < TREES_NUMBER; i++) {
    if (filesizes[i] < min_size) {
      min_size = filesizes[i];
      index = i;
    }
  }
  *best_result_size = min_size;
  return index;
}
```

PCA Heuristic

In some embodiments, a set of 256 possible symbol frequencies for each 8-bit character of an input bit stream is treated as a set of dimensions, in the context of a PCA heuristic calculation. To identify a specific file type for a given file, principal components can be extracted from the file. After subsequently calculating the principal component for a current set of symbol frequencies, a static tree that is the most similar may be identified.

PCA can be performed by eigenvalue decomposition of a data covariance (or correlation) matrix, or by singular value decomposition of a data matrix after normalization of the initial data (where "initial data" refers to the frequencies of the byte symbols in the input file). A normalization can be performed, by "mean centering" (i.e., subtracting each data value from its measured mean to render its empirical average zero). In the case of a character/symbol frequency distribution, a normalizing of the variable using Z-scores may not be needed, as the values naturally add up to 1.

Singular value decomposition is based on following formula:

$$X = U\Sigma W^T$$

where X is a matrix having dimensions "n" by "p" (e.g., 64×256—a number of static trees by a number of characters), U is an "n" by "n" by "n" matrix, the columns of which are orthogonal unit vectors, of length "n," referred to as the left singular vectors of X, is an "n" by "p" diagonal matrix of positive numbers "σ," referred to as the singular values of X, and W is a "p" by "p" matrix whose columns are orthogonal unit vectors of length "p" and referred to as the right singular vectors of X.

To obtain the projection of data onto a small number of dimensions, the following calculation can be performed:

$$T_L = XW_L$$

where $W_L$ is a truncated matrix comprising the first most important singular vectors of X.

In some embodiments, the task of reducing a set of 256 components to a few dimensions can be performed, for example, using Python libraries such as Pandas, NumPy and scikit-learn. For example, a header "pca.h" can be generated using a Python script. The header "pca.h" includes precomputed vectors derived from the saved symbol frequencies for the static trees that are computed during generation of the static tree header. The Python script also creates a sorted array that includes both projected values for each tree and their respective indexes. The sorted array is used to retrieve the index of the most similar static trees.

In some embodiments, to reduce the number of multiplications performed, only the first primary component is used, since the result of a scikit-learn function explained_variance_ratio( ) showed that the first primary component accounts for 49% of variance (and the subsequent two primary components account for 17% and 14% of variance, respectively). To obtain the first primary component, the symbol frequencies of the given literal buffer can be multiplied by the precomputed vector. The function get_PCA_value( ) can then be used to calculate the primary component, as shown in the following example code:

```
static void STEALTH_INLINE get_PCA_value(uint32_t* _restrict redux,
                                         double* _restrict pca_value,
                                         uint64_t file_size) {
    for (int i = 0; i < ALPHABET_SIZE; i++) {
        double freq = (double)redux[i] / (double)file_size;
        //centering the current tree frequency using precomputed mean
        freq -= tree_vecs[i][1];
        *pca_value += freq * tree_vecs[i][0];
    }
}
```

The first primary component can then be located, within the presorted array that includes all values for all static trees.

To improve the robustness of the PCA heuristic, operations can be performed on a range of similar static trees (e.g., with 12 static trees being considered in each pass). Using this reduced set of static trees we find, the static tree having the smallest file size can be identified, e.g., in a manner similar to that of the cross-entropy method, described herein. This reduced-set processing can increase the speed at which the best static tree identified, by at least four-fold, as the number of multiplications is significantly reduced.

The following is example source code for a function that is responsible for selecting a best static tree, using the PCA heuristic:

```
uint64_t STEALTH_INLINE get_min_file_size_pca_range
(uint32_t* freqs,
                          uint8_t pca_index,
                          uint8_t* best_index,
                          uint8_t* best_pca_index) {
    uint8_t start = pca_index >= 6 ? pca_index - 6 : 0;
    uint8_t end = pca_index <= TREES_NUMBER - 7 ? pca_index + 6 :
    TREES_NUMBER - 1;
    //acount for indexes close to both ends of the array of trees
    if (end - start < 12) {
        if (start == 0) {
            end = 12;
        }
        else {
            start = end - 12;
        }
    }
    uint8_t index = (uint8_t)tree_values[start][1];
    uint64_t min_file_size = calculate_file_size(static_encoders[index],
    freqs, ALPHABET_SIZE);
    *best_pca_index = start;
    for (int i = start + 1; i <= end; i++) {
        uint8_t current_index = (uint8_t)tree_values[i][1];
        uint64_t current_size = calculate_file_size(static_encoders
[current_index], freqs, ALPHABET_SIZE);
        if (current_size < min_file_size) {
            min_file_size = current_size;
            index = current_index;
        }
    }
    *best_index = index;
    return min_file_size;
}
```

In experiments comparing the cross-entropy heuristic with the PCA heuristic, the PCA heuristic has been shown to perform significantly faster, however, it has a lower accuracy as compared with the cross-entropy heuristic, since the latter is certain to identify the best static tree available. As such, the PCA heuristic may be selected when the fastest possible compression level is desired, and where some accuracy can be sacrificed in favor of speed.

Building Custom Huffman Trees

In some embodiments, generating a custom prefix includes three phases. During a first phase, a prefix_element array is generated by taking the raw counts of the symbol frequencies and adding 1 to each of the raw counts, to account for each possible character. A check may be performed to ensure that there is a codeword for each character, in case there was an error with counting the symbol frequencies in the buffer. The incremented counts of the characters are then placed into a prefix_element structure, for example using a function uint32_to_prefix_element( ). Symbol frequencies saved in prefix_element are then sorted in ascending order.

During a second phase, a canonical prefix without a length limit is generated, e.g., using a function stealth_build_prefix ( ). As used herein, "canonical" means that none of the codewords is a prefix of another codeword (thereby rendering the decoding process more efficient). The prefix length can be limited, for example to a length of 11, which restricts the size of the look up table to 2048 elements ($2^{11}$). A look-up table facilitates the rapid decoding of characters that have been encoded with a canonical prefix.

In some embodiments, the function stealth_build_prefix ( ) allocates memory for all nodes of a tree, then initializes parent nodes to include an unsigned integer (e.g., a maximum 32-bit unsigned integer). In a main loop, two consecutive nodes are joined to form a parent node if they have a smaller symbol frequency than the current parent node. Otherwise, the two consecutive nodes are joined with a parent node, or two parent nodes form a new parent node with the sum of their respective symbol frequencies. The foregoing process may be repeated until a root node is created.

The stealth_build_prefix( ) function returns a maximum depth of the tree. Example source code for the stealth_build_prefix( ) function is as follows:

```
/* stealth_build_prefix: Create a perfect prefix without limit in depth based on
* the element frequencies */
uint32_t stealth_build_prefix(prefix_element* freqs, uint16_t nb_elem) {
    stealth_print_debug("build prefix"});
    uint32_t child_position = 0;
    int parent_position = nb_elem + 1;
    uint32_t* nodes = calloc(256 * 30, sizeof(unit32_t));
    uint32_t node_position = parent_position;
    const uint32_t node_last_position = 2 * nb_elem;
    uint32_t sam11_1 = 0, sam11_2 = 0;
    // init parents with a big threshold
    for (int i = parent_position - 1; i < parent_position + nb_elem +1; i++)
        freqs[i].freq = 0xffffffff;
    while (node_position < node_last_position) {
        // compare child and parents to save the smallest
        if (freqs[child_position].freq <= freqs[parent_position].freq) {
            sam11_1 = child_position;
            ++child_position;
        }
        else {
            sam11_1 = parent_position;
            parent_position++;
        }
        if (freqs[child_position].freq <= freqs[parent_position].freq) {
            sam11_2 = child_position;
            ++child_position;
        }
        else {
            sam11_2 = parent_position;
            ++parent_position;
        }
```

```
        // merge two child to create a parent
        // or merge a child with parent
        // or merge two parents
        freqs[node_position].freq = [sam11_1].freq + freqs[sam11_2].freq;
        // for node_position < nb_elem save which chaild is associate with
which
        // parent for node_position >= nb_elem + 1 save how many time we
use the
        // parent
        *(nodes + sam11_1) = *(nodes + sam11_2) = node_position++;
    }
    --parent_position;
    // Give weight
    while (parent_position >
        nb_elem) { // We count how many time the parent has bee used
        freqs[parent_position].nb_bits = freqs[nodes[parent_position]].nb_bits
+ 1;
        --parent_position;
    }
    parent_position = 0;
    while (parent_position <
        nb_elem) { // We associate the child with his parent if he has
        freqs[parent_position].nb_bits = freqs[nodes[parent_position]].nb_bits
+ 1;
        ++parent_position;
    }
```

In a third phase, if the maximum depth is more than 11, a Kraft-McMillan inequality ("Kraft's inequality") can be used to adjust the lengths down to maximum. Kraft's inequality limits the lengths of codewords in a prefix code. For example, if one takes an exponential of the length of each valid codeword, the resulting set of values will have a probability mass function, i.e., a total measure less than or equal to one. Kraft's inequality can be thought of in terms of a constrained budget to be spent on codewords, with shorter codewords being more expensive. Characters having extraneous lengths can be moved upwards within the tree (i.e., their symbol frequencies can be incremented to achieve higher positions in the tree).

Encoding with a Huffman Tree

In some embodiments, once a best tree has been selected for compressing the literals, the process of encoding literals is similar whether a custom generated prefix tree has been selected or a precomputed static tree has been selected. For custom prefix trees, the following additional steps may be performed: generating the symbols used for encoding, and saving the custom prefix encoder to the header struct. Static trees can be saved in a file (e.g., stealth_static_trees.h), for example in the form of prefix_encoder arrays that already include precomputed symbols, as follows:

```
    typedef struct {
        //encoded code-word value
        uint16_t val;
        //Size of the code-word in bit
        uint8_t size;
    } prefix_encoder;
```

In one or more embodiments, the process of encoding the literals is performed using a Huffman encoding technique. To utilize out-of-order execution, four streams can be generated. The following example code illustrate the implementation of a main encoding loop:

```
uint8_t* ip[4] = { buf_in + (0 * block_parser), buf_in + (1 *
block_parser), buf_in + (2 * block_parser), buf_in + (3 * block_parser) };
    uint8_t* end[4] = { ip[0] + block_parser, ip[1] + block_parser, ip[2] +
block_parser, ip[3] + block_parser };
```

```
    // Create 4 streams of encoded data to allow the decoder to perform
Out of Order execution
    for (int i = 0; i < 3; i++) {
        while (ip[i] < end[i]) {
            op.queue |= ((uint64_t)encoder[*ip[i]].val << op.pos_byte);
            op.pos_byte += encoder[*ip[i]++].size;
            op.queue |= ((uint64_t)encoder[*ip[i]].val << op.pos_byte);
            op.pos_byte += encoder[*ip[i]++].size;
            op.queue |= ((uint64_t)encoder[*ip[i]].val << op.pos_byte);
            op.pos_byte += encoder[*ip[i]++].size;
            op.queue |= ((uint64_t)encoder[*ip[i]].val << op.pos_byte);
            op.pos_byte += encoder[*ip[i]++].size;
            flush_queue(&op);
        }
        if (op.pos_byte)
            op.pos_buf++;
        op.pos_byte = 0;
        op.queue = 0;
        header->literal_block_sizes[i] = op.pos_buf - stealth->
buffer_out.begin;
    }
```

The loop procedure shown above can be applied to both static trees and custom prefix trees. The saved positions in the output buffer facilitate out-of-order decoding of literals (described further below). Another advantage of using static trees is that the look-up tables used for decoding literals may be precomputed, and thus ready to use (as described herein).

Bubble Up Encoding

In some implementations, the static tree performance is similar to the performance of the custom prefix tree, for example when the size of the literal buffer is small (e.g., less than a predefined BUBBLE_SIZE threshold, for example 2,000) and/or when the difference between the result size from the static tree is no more than twice the BUBBLE_SIZE threshold.

In some embodiments, a "bubble up" process, as described herein, can be used to correct the result for the static tree, such that the corrected result is closer to an optimal entropy, by replacing or changing the positions of the characters in the sorted encoding length array. To facilitate bubble up corrections, a sorted array, sorted codewords, and rank tables for the symbols are generated at the same time that the static trees header is automatically generated. To apply bubble up, a first step is generating an inverted index array. The function init_bubble_table( ) can be used to perform this step, example code for which is as follows:

```
static void STEALTH_INLINE init_bubble_table(stealth_codec* stealth,
uint8_t tree_index)
{
    memcpy(stealth->rank_table, trees_ranks[tree_index],
ALPHABET_SIZE * sizeof(unsigned char));
    for (int i = 0; i < 256; i++) {
        stealth->literal_table[stealth->rank_table[i]] = i;
    }
}
```

During bubble up encoding, as symbols are encoded using the look-up table, the rank of each symbol encountered in the literal buffer is updated. Consequently, the higher the frequency of a symbol, the shorter its length. Below is example code for implementing encode_bubble( ):

```
static void STEALTH_INLINE encode_bubble(stealth_codec* stealth,
                                          unsigned char* byte,
                                          stealth_buffer* op,
                                          prefix_encoder* tree) {
```

```
    const uint32_t pos = stealth->literal_table[*byte];
    const uint32_t pos_tmp = pos - (pos > 0);
    const uint32_t s1 = stealth->rank_table[pos_tmp];
    op->queue |= ((uint64_t)tree[pos].val << op->pos_byte);
    op->pos_byte += tree[pos].size;
    stealth->rank_table[pos_tmp] = *byte;
    stealth->rank_table[pos] = s1;
    stealth->literal_table[s1] = pos;
    stealth->literal_table[*byte] = pos_tmp;
}
```

The foregoing process can be replicated during decoding (as further described herein), as both the rank table for characters and the sorted codewords are available for each static tree.

Custom Tree Reuse

In some embodiments, to accommodate large files, an internal chunking process is used, in which the input buffer is divided into chunks of a given size (e.g., 128K bytes each). As the custom prefix tree takes 128 bytes to store in the header, while the chunks of a specific file tend to have similar frequencies of symbols/characters, the custom prefix encoder arrays can be saved/stored for reuse, thereby saving the space that would otherwise be wasted for another custom prefix.

The saved custom prefix trees can be included in cross-entropy calculations. If one of the previously saved prefixes is determined to be preferable to a custom prefix, it can be reused, and then only its index saved in the header. On the decoding end, the custom look-up tables can also be saved in the same order.

Custom tree reuse can be beneficial to both encoding and decoding speeds. For encoding, custom tree reuse can save time and computing resources that would otherwise be spent on building a custom prefix tree, as the size of the custom prefix tree is only estimated. For decoding, custom tree reuse has the advantage of having a precomputed look-up table. The computational overhead associated with calculating cross-entropy for additional trees is negligible in comparison.

Automatic Static Tree Generator

Static trees described herein can be generated using a tree generator standalone application. In some embodiments, a tree generator application can be used to improve the compression ratio for a specific user-defined dataset. For example, the tree generator application may generate an appropriate set of static trees for the specific files types the user is compressing, and store them in a resource file. As the static trees would thus be more tailored to the needs of the user, they may offer higher compression and decompression speeds, at a ratio very close to the custom prefix trees.

Triad Encoding

In some embodiments, data to be encoded is treated as having two distinct parts—small integers in a lower range (e.g., the range of [0-100]), and large integers in an upper range (e.g., the range of [100-$2^{20}$]). In the triad structure, the small integers can represent the length and the number of literals smaller than 100, while the large integers can represent all of the offsets, as well as the length/number of literals larger than 100.

Small Integer Encoding can be performed using the same approach used for literal encoding, with a static tree selector and a custom tree builder (see "Byte Literal Encoding").

Large Integer Encoding: representing a large integer using a variable length code word, and achieving as close as possible to Shannon Entropy, are major challenges of entropy coding. Known method for encoding large integers use pre-set intervals defined by the logarithm base two of the large integers:

interval=log 2(integer)
reduced_integer=integer-($2^{\wedge}$ interval)
encoded_integer=interval variable code word+reduced_integer The interval variable code word is typically generated by a Huffman tree builder and decoded by a lookup table. Since the intervals are fixed, they may not be optimal, and a lookup table is also needed to decode the interval number.

Figure 4:
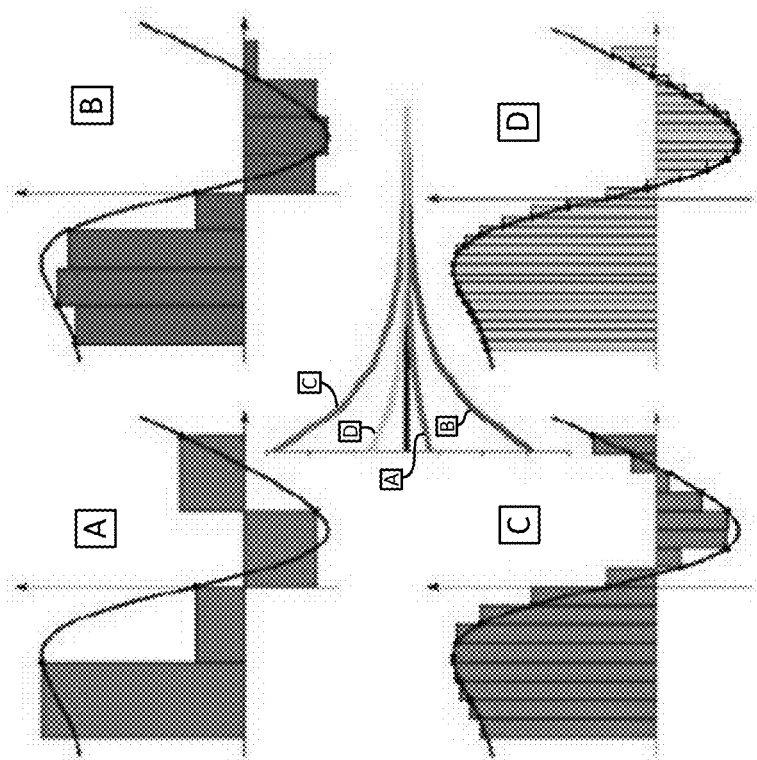
FIG. 4 shows example Riemann Sums.

To address this problem, and according to some embodiments, a novel Large Integer Encoding (LIE) technique is inspired by the Riemann Sum, examples of which are shown in FIG. 4. One of the applications of the Riemann Sum, in electronics, is to convert an analog signal to a digital signal by approximating the area below the analog waveform. The approximation is the result of the integration by parts of the analog curve, at given interval sizes. In such applications, the integration of every interval returns an integer that can be readily interpreted or represented by a numeric signal. The size of the intervals is a constant that can be based on a desired accuracy. As applied herein, the Riemann approach is reversed, such that large integer frequencies are converted into tables (called "Riemann tables") that describe the entropy in $base_2$. The frequency curve can be represented as an analog signal, and the large integer codewords can be represented as digital intervals.

Figure 5:
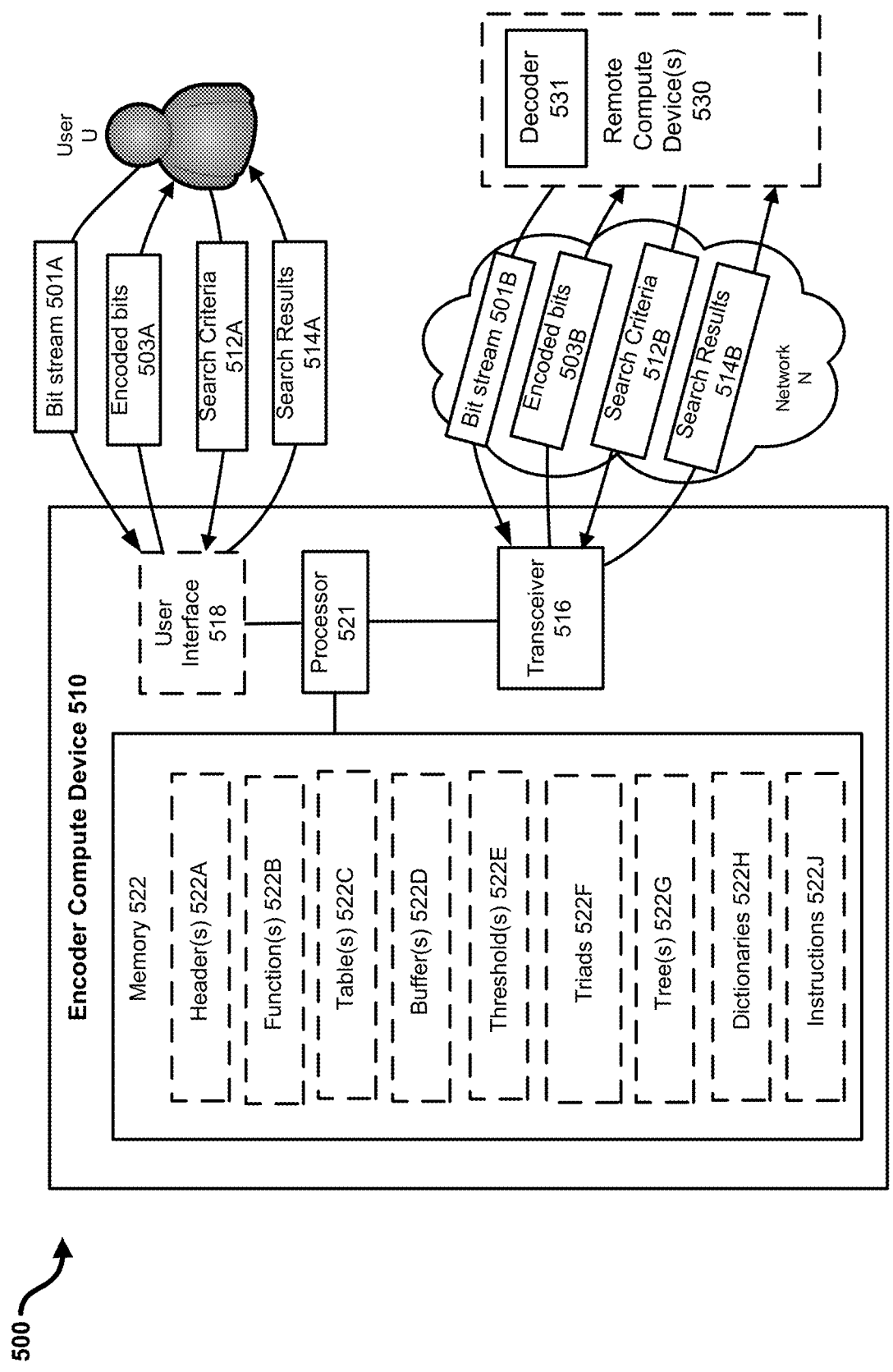
FIG. 5 is a diagram of an example encoder system, according to some embodiments.

FIG. 5 is a diagram of an example encoder system 500, according to some embodiments. As shown in FIG. 5, the system 500 includes an encoder compute device 510 including a processor 521 operably coupled to a transceiver and a memory 522. The processor is optionally also operatively coupled to a user interface 518 (e.g., a GUI) through which a user "U" can interact. The encoder compute device 510 can communicate, via the transceiver 516 and a network "N" (e.g., a wireless communications network or a wired communications network), with one or more remote compute devices 530. Each of the remote compute devices 530 can function as, or include, a decoder 531, implemented in software and/or hardware. For example, the decoder 531 can include some or all of the components of the encoder compute device 510. The memory 522 includes/stores one or more of headers 522A, functions 522B, tables 522C, buffers 522D, thresholds 522E, triads 522F, trees 522G, dictionaries 522H, or instructions 522J (i.e., processor-executable instructions to perform one or more tasks as described herein). During operation, the user "U" can input, via the user interface 518, a bit stream 501A to the encoder compute device 510 for compression, and in response receive, via the user interface 518, encoded bits 503A. Alternatively or in addition, the user "U" can input, via the user interface 518, search criteria 512A, and in response receive, via the user interface 518, search results 514A. As discussed herein, the encoder compute device 510 can generate search results based on search criteria without decoding compressed data. Also during operation, the one or more remote compute devices 530 can send, to the transceiver 516 and via the network N, a bit stream 501B to the encoder compute device 510 for compression, and in response receive, via the transceiver 516 and the network N, encoded bits 503B. Alternatively or in addition, the one or more remote compute devices 530 can send, to the transceiver 516 and via the network N, search criteria 512B, and in response receive, via the transceiver 516 and the network N, search results 514B.

Example: Large Integer Encoding

In some embodiments, the modeling single pass and double pass record the frequencies of the offsets that are large integers, and produce a frequency curve by using a triple lookup table called LMH_LUT with different accuracies:

[0-4,095]: using an accuracy of ±16 (High)
[4,096-65,535]: using an accuracy of ±256 (Medium)
[65,536: 1,048,575]: using an accuracy of ±4,096 (Low)

The amount of memory required is: 3*256*log 2(input size) bytes.

Compare to a classic frequency table: input_size*log 2(input size) bytes.

To lower the memory usage, the triple LUT is advantageous when the input size to encode is larger than 3*256=768 bytes (which represents all standard chunk sizes).

The following is example code to implement the function that embodies this process:

```
static void STEALTH_INLINE get_elemt_freq(uint32_t
    LMH_LUT[3][256], uint32_t offset,
    uint32_t*save) {
    //Get which table we are falling in
    uint8_t it=((offset>>16)>0)+((offset>>12)>0);
    //Calculate the reduced element
    const uint8_t reduced=
    (offset>>lmhtest[((Offset>>16)>0)+((offset>>12)>0)])
        & 255;
    LMH_LUT[it][reduced]++;
    //Save it
    *save=(uint32_t)(offset|(uint32_t)reduced<<20|
        (uint32_t)it<<28);
}
```

As discussed above, LIE can be used to encode large integers. The following is an example of a frequency curve approximation performed using the Riemann Sum (N=2^20/accuracy):

$$N = \frac{2^{\wedge}20}{\text{Accuracy}} \text{range} = \frac{2^{\wedge}20}{N}$$

$$freq(\text{offset}) = \frac{1}{\ln(2) * \text{offset}}$$

$$FREQ(\text{offset}) = \int_{1}^{2^{\wedge}20} \frac{1}{\ln(2) * \text{offset}} d \text{ offset}$$

$$RieamannSum = \sum_{i=1}^{N} \int_{\text{range} \circ i}^{\text{range} \circ (i+1)} \frac{1}{\ln(2) * \text{offset}} d \text{ offset}$$

RieamannSum =

$$\int_{1}^{\text{range}} \frac{1}{\ln(2) * \text{offset}} d \text{ offset} + \int_{\text{range}}^{\text{range} \circ 2} \frac{1}{\ln(2) * \text{offset}} d \text{ offset} + $$

$$\ldots + \int_{\text{range } + (N-1)}^{2^{\wedge}20} \frac{1}{\ln(2) * \text{offset}} d \text{ offset}$$

$$RieamannSum = [FREQ(\text{range}) - FREQ(1)] + \ldots + [$$
$$FREQ(2^{\wedge}20) \cdot FREQ(\text{range}^*(N-1))]$$

$$RieamannSum = \underbrace{(\log 2(\text{range}) - 0)}_{\text{size1}} + \ldots + \underbrace{(20 - \log 2(\text{range}^*(N-1)))}_{\text{sizeN}}$$

From the size [$size_1$-$size_N$], a Riemann compression table can be generated, and the large integers can be encoded. However, the foregoing approach is limited by a predefined range, and may not compress with an entropy that is close to the optimal entropy. As such, LIE uses a reversed approach: making the range a variable and the integration of the curve a constant based on the preferred entropy to add granularity, for example as follows:

$$N = \frac{2^{\wedge}20}{\text{Accuracy}} \text{Ideal} = \frac{\sum_{1}^{2^{\wedge}20} freq(\text{offset})}{N}$$

$$freq(\text{offset}) = \frac{1}{\ln(2) * \text{offset}}$$

$$FREQ(\text{offset}) = \int_{1}^{2^{\wedge}20} \frac{1}{\ln(2) * \text{offset}} d \text{ offset}$$

Stealth Riemann =

$$\int_{1}^{\text{rangeA}} \frac{1}{\ln(2) * \text{offset}} d \text{ offset} + \int_{\text{rangeA}}^{\text{rangeB}} \frac{1}{\ln(2) * \text{offset}} d \text{ offset} + $$

$$\ldots + \int_{\text{range } + (N-1)}^{2^{\wedge}20} \frac{1}{\ln(2) * \text{offset}} d \text{ offset}$$

With every range determined by:

$$\text{ideal} = \int_{1}^{\text{rangeA}} \frac{1}{\ln(2) * \text{offset}} d \text{ offset}, \ldots ,$$

$$\text{ideal} = \int_{\text{range } + (N-1)}^{2^{\wedge}20} \frac{1}{\ln(2) * \text{offset}} d \text{ offset}$$

$$RieamannSum = \underbrace{(\log 2(\text{range}A) - 0)}_{\text{size1}} + \ldots + \underbrace{(20 - \log 2(\text{range}(N-1)))}_{\text{sizeN}}$$

Here, the range is not predefined and is computed based on an approximation, constrained only by the accuracy selected, which provides a Riemann compression table much closer to the optimal entropy than is possible using known techniques:

| Interval of large integers | Code-word length |
| --- | --- |
| [1 – rangeA] | $Size_1$ |
| [rangeX – range(X + 1)] | $Size_X$ |
| [range(N – 1) – 2^20] | $Size_N$ |

The encoded large integer framework is:

| Interval number, size: log2(N) | Integer's code-word, size: $Size_X$ |
| --- | --- |

Since the interval number is a fixed size, no lookup table is needed at the decoder.

The LIE table can be generated, for example, using the function Riemann_master_of_the_tables( ). The following example code can be used to implement the main loop that accomplishes the process of building the ranges.

```
// loop all the range and weight them, the number of range is determined by
// total_of_range · number_of_allocated_range
   while (remaining_range) {
      // Base two approximation of the frequency curve: We calculate the size of
      // the next range to conpare it with the theorical range
      uint32_t next_sum = base + ((1 << nb_bit));
      actual_sum = 0;
      uint32_t i = iterator;
      // Integrate the next candidate range
      Riemann_integrator (actual_sum, it_acc, global_LUT);
      // We have a range big enough to be stored definetly
      if (actual_sum >= Reimann_Sum) {
         // Was the previous range closer to entropy! Caused by the power of two approxima
//tion the last range might not be the best, in that case it saves the previous one
         const int32_t sum1 = Reimann_Sum - actual_sum_p;
         const int32_t sum2 = actual_sum - Reimann_Sum;
         if (sum2 > sum1 && nb_bit > accuracy[it_acc_p] && remaining_range > 1 &&
               actual_sum_p) {
                  // Saves the previous range
            range_LUT[it_range].base = base;
            range_LUT[it_range++].size = (nb_bit - 1) + header_size;
            it_acc = it_acc_p;
            actual_sum = actual_sum_p;
         // Increase the iterator and correct it in the case that we shifted the accuracy,
         // if the accuracy changed during the range building, the number of element in
//this range might not be base two
            iterator += (uint32_t)(1 << (nb_bit - 1));
            iterator &= ((uint32_t)0xffffffff << accuracy[it_acc_p]);
         } else {
         // Increase the iterator and correct it in the case that we shifted the accuracy
            range_LUT[it_range].base = base;
            range_LUT[it_range++].size = nb_bit + header_size;
         // Increase the iterator and correct it
            iterator += (uint32_t)(1 << nb_bit);
            iterator &= ((uint32_t)0xffffffff << accuracy[it_acc]);
         }
      // Correct Reimann approximation: it corrects the optimal curve caused by
      // the appoximation of the curve
      remaining_range--;
      remaining_elemt --
         remaining_elemt < actual_sum ? remaining_elemt : actual_sum;
      if (remaining_range > 1)
         Reimann_Sum = remaining_elemt < remaining_range
                        > remaining_elemt
                        : (remaining_elemt / remaining_range);
      else
         Reimann_Sum = remaining_elemt;
   }
```

Since all of the ranges are base$_2$, each time the integration reaches a preferred value, a check can be performed to determine whether the previous range was preferable. If so, the previous range can be selected, and the preferred value can be recomputed based on the previous range. As the frequency curve is split on the three arrays, if one range is across two arrays the function will respect the accuracy of both arrays by applying a correction to the range.

In some embodiments, once the LIE table is built, the triple lookup table used to store the frequencies is reused and gets populated, for example by populate_Reimann_LUT( ), for use during the encoding. The following example code can be used to implement one of the three loops used to populate the array:

```
//Populate the high accuracy table
   while         (offset<base+range_size         &&
      offset<LS_REIMANN_THRESHOLD) {
   LMH_LUT[LS_PT][(offset>>HIGH_ACC) & 255]=
      (uint32_t) base;
   LMH_LUT[LS_PT][(offset>>HIGH_ACC) & 255]|=
      (uint32_t) (i<<25);
   LMH_LUT[LS_PT][(offset>>HIGH_ACC) & 255]|=
      (uint32_t) (custom_ranges[i].size<<20);
}
```

| Range identification | Size of the range | Element base |
|---|---|---|
| 7 bits | 5 bits (up to 32) | 20 bits (up to 2 ^20 − 1) |

Large Integer Tree Encoding

In some embodiments, there are two ways in which an LIE tree can be encoded: (1) encoding the ranges by using 5 bits to describe the ranges, and (2) The delta coder, discussed below, to describe the difference between two consecutive ranges.

To determine which technique to use for the encoding of the tree, the number of bits to use to encode the biggest delta can be calculated, as shown below:

$$delta\_size = \log 2(max\_delta)$$

with max_delta being the biggest difference between two consecutives ranges, computed by get_max_delta( ).

If delta size is greater than 4 bits, method (1) may be used. If delta_size is less than or equal to 4 bits, the delta coder, executed by write_table_unlinear( ), can be used, for example as follows:

```
if (logs.elemt_size < 5) {
    // Encode the first element
    op->queue |= ((custom_ranges[0].size - header_size) << op->
pos_byte);
    op->pos_byte += 5;
    flush_queue(op);
    // Write canonical table
    for (int i = 1; i < nb_range; i += 1) {
        // size use 64 bit to be able to shift it without overflow
        const uint64_t size = custom_ranges[i].size >=
        custom_ranges[i - 1].size ?
            (custom_ranges[i].size - header_size) -
            (custom_ranges[i - 1].size -
        header_size) + logs.ref_pos : logs.ref_pos -
            ((custom_ranges[i - 1].size -
        header_size) - (custom_ranges[i].size - header_size));
```

-continued

```
        op->pos_byte += logs.elemt_size;
        flush_queue(op);
    }
}
else {
    for (int i = 0; i < nb_range; i += 1) {
        op->queue |= (((custom_ranges[i].size - header_size) & 31) << op->
pos_byte);
        printf("|%u", (custom_ranges[i].size - header_size));
        op->pos_byte += 5;
        flush_queue(op);
    }
}
```

Large Integer Frequency Counting

In some embodiments, the LIE records large integer frequencies using variable ranges based on the chunk size, rather than saving the frequencies in a static triple LUT.

The following table presents example accuracy values, with the number of bits used by the different LUTs. When the size of the LUT is 256, to update the frequency of one offset, a shift may be performed by the accuracy specified, and the next 8 bits ($2^8$=256) masked.

| chunk size | LUT1 | LUT2 | LUT3 |
|---|---|---|---|
| 4K | 1 | 4 | 8 |
| 8k | 1 | 5 | 9 |
| 16k | 2 | 6 | 10 |
| 32k | 3 | 7 | 11 |
| 64k | 4 | 8 | 12 |
| 128k | 4 | 8 | 12 |

The following example code can be used to implement the function select_LUTs_accuracies( ), which selects an accuracy based on the chunk size:

```
static void select_LUTs_accuracies(uint32_t buf_size, uint8_t* acc1,
uint8_t* acc2, uint8_t* acc3) {
    uint8_t rate = 0;
    *acc1 = 4, * acc2 = 8, * acc3 = 12;
    bitScanReverse(rate, buf_size);
    rate++;
    if (rate > 19) {
        return;
    }
    *acc1 = ((int8_t)*acc1 - (20 - rate)) > 0 ? (*acc1 - (20 - rate)) : 0;
    *acc2 = ((int8_t)*acc2 - (20 - rate)) > 0 ? (*acc2 - (20 - rate)) : 0;
    *acc3 = ((int8_t)*acc3 - (20 - rate)) > 0 ? (*acc3 - (20 - rate)) : 0;
}
``` get_freq( ) is also updated to be able to use the new variable accuracies:

```
static void STEALTH_INLINE get_freq(uint32_t LMH_LUT[3][256], uint32_t offset,
    uint32_t* save, const uint8_t LUT_accs[3]) {
    // Get which table we are falling in
    uint8_t it = ((offset >> (LUT_accs[1] + 8)) > 0) + ((offset >> (LUT_accs[0] + 8))
> 0);
    // Calculate the reduced element
    const uint8_t reduced = (offset >> LUT_accs[((offset >> (LUT_accs[1] + 8)) > 0) +
((offset >> (LUT_accs[0] + 8)) > 0)]) & 255;
    LMH_LUT[it][reduced]++;
    // Save it
    *save = (uint32_t)(offset | (uint32_t)reduced << 20 | (uint32_t)it << 28);
}
```

Variable Number of Ranges

In some embodiments, to better scale to the frequency curve, the number of ranges can be variable.

Repeated Large Integer Encoding

In some embodiments, in LZ Offsets, large integers can be repeated sequentially. It can be advantageous to include repeated offsets, for example up to the fourth position from a current offset. These repeated offsets can be encoded as numbers from 0 to 3, and can be assigned ranges according to ratios of their encoded numbers to the number of total offsets. For example, if repeated offsets account for more than 50% of all offsets, half of the ranges will be assigned to repeated offsets.

The function Riemann_builder_repeated_offset_tables( ) assigns the ranges for all the repeated offsets, taking into account boundary conditions. For example, at least one range may be desired for each existing repeated offset, and a condition may be enforced such that the existing repeated offset(s) do not overlap with regular offset ranges.

Encoding Triad in Blocks

In some embodiments, once Riemann encoding of one or more offsets has been performed, Huffman trees are generated for both length and number of literals, in a manner similar to that of encoding the literals buffer. In the case of files that include more than 1 block of 128 KB, these trees can be reused, as they are saved in a special structure. Triads can be encoded in blocks having a size that is defined in stealth_structure.h (e.g., set to 128). The length buffer, number of literals buffer and offset buffer can be encoded separately, in chunks of the block size, for example to facilitate buffered decoding that relies on using stack memory. The foregoing procedure was shown to be faster on decoding, especially on smaller chunks. The following figure presents example schematic encoding of triads in an output buffer:

| Length encoding 128 elements | Number of literals encoding 128 elements | Offset 128 elements | Length encoding 128 elements | Number of literals encoding 128 elements | Offset 128 elements |
|---|---|---|---|---|---|

In some embodiments, all of the triad elements are encoded using unrolled for loop to utilize Out-of-Order compiler optimization.

Byte Literal Decoding
Custom Tree Decoding

In some embodiments, decoding literals with a custom tree includes rebuilding the prefix_encoder array from a saved custom prefix. A function create_symbols( ) can be used to perform this task. The custom prefix can be read from the header for each chunk, and the following example code can be used to implement a loop that creates the look up table for decoding:

```
prefix_decoder LUT[PREFIX_LUT_SIZE];
    for (int i = 0; i < ALPHABET_SIZE; i++) {
        if (custom_tree_encoder[i].size == 0) continue;
        uint16_t base = custom_tree_encoder[i].val;
        uint16_t add = (1 << custom_tree_encoder[i].size);
        const prefix_decoder tmp = { custom_tree_encoder[i].size, i };
        do {
            LUT[base] = tmp;
            base += add;
        } while (base < PREFIX_LUT_SIZE);
    }
```

During decoding, the compressed buffer can be read into a 64-bit queue, and a logical AND operation can be performed, for example using a function PREFIX_LUT_MASK. The resulting value is then used as an index in the look up table, to retrieve original symbol values and sizes. Afterwards, the queue is shifted by the number of bits saved in the size field of prefix_decoder struct. This process can also be performed using out-of-order execution, to increase decoding speed. The values of block sizes saved during the encoding process are used to determine the location of the starting points for each of the four streams. The following example code can be used to implement the main decoding loop, whether decoding with a custom tree or a static tree:

```
// This loop decode 4 elements at a time
    while (op_4 < end) {
        fill_queue(&ip_1);
        *op_1++ = LUT[(ip_1.queue >> ip_1.pos_byte) & PREFIX_LUT_MASK].val;
        ip_1.pos_byte += LUT[(ip_1.queue >> ip_1.pos_byte) & PREFIX_LUT_MASK]
.size;
        *op_1++ = LUT[(ip_1.queue >> ip_1.pos_byte) & PREFIX_LUT_MASK].val;
        ip_1.pos_byte += LUT[(ip_1.queue >> ip_1.pos_byte) & PREFIX_LUT_MASK]
.size;
        *op_1++ = LUT[(ip_1.queue >> ip_1.pos_byte) & PREFIX_LUT_MASK].val;
        ip_1.pos_byte += LUT[(ip_1.queue >> ip_1.pos_byte) & PREFIX_LUT_MASK]
.size;
        *op_1++ = LUT[(ip_1.queue >> ip_1.pos_byte) & PREFIX_LUT_MASK].val;
        ip_1.pos_byte += LUT[(ip_1.queue >> ip_1.pos_byte) & PREFIX_LUT_MASK]
.size;
        fill_queue(&ip_2);
        *op_2++ = LUT[(ip_2.queue >> ip_2.pos_byte) & PREFIX_LUT_MASK].val;
        ip_2.pos_byte += LUT[(ip_2.queue >> ip_2.pos_byte) & PREFIX_LUT_MASK]
.size;
        *op_2++ = LUT[(ip_2.queue >> ip_2.pos_byte) & PREFIX_LUT_MASK].val;
        ip_2.pos_byte += LUT[(ip_2.queue >> ip_2.pos_byte) & PREFIX_LUT_MASK]
.size;
        *op_2++ = LUT[(ip_2.queue >> ip_2.pos_byte) & PREFIX_LUT_MASK].val;
        ip_2.pos_byte += LUT[(ip_2.queue >> ip_2.pos_byte) & PREFIX_LUT_MASK]
.size;
        *op_2++ = LUT[(ip_2.queue >> ip_2.pos_byte) & PREFIX_LUT_MASK].val;
        ip_2.pos_byte += LUT[(ip_2.queue >> ip_2.pos_byte) & PREFIX_LUT_MASK]
.size;
        fill_queue(&ip_3);
        *op_3++ = LUT[(ip_3.queue >> ip_3.pos_byte) & PREFIX_LUT_MASK].val;
        ip_3.pos_byte += LUT[(ip_3.queue >> ip_3.pos_byte) & PREFIX_LUT_MASK]
.size;
        *op_3++ = LUT[(ip_3.queue >> ip_3.pos_byte) & PREFIX_LUT_MASK].val;
        ip_3.pos_byte += LUT[(ip_3.queue >> ip_3.pos_byte) & PREFIX_LUT_MASK]
.size;
        *op_3++ = LUT[(ip_3.queue >> ip_3.pos_byte) & PREFIX_LUT_MASK].val;
        ip_3.pos_byte += LUT[(ip_3.queue >> ip_3.pos_byte) & PREFIX_LUT_MASK]
.size;
        *op_3++ = LUT[(ip_3.queue >> ip_3.pos_byte) & PREFIX_LUT_MASK].val;
        ip_3.pos_byte += LUT[(ip_3.queue >> ip_3.pos_byte) & PREFIX_LUT_MASK]
.size;
        fill_queue(&ip_4);
        *op_4++ = LUT[(ip_4.queue >> ip_4.pos_byte) & PREFIX_LUT_MASK].val;
        ip_4.pos_byte += LUT[(ip_4.queue >> ip_4.pos_byte) & PREFIX_LUT_MASK]
.size;
        *op_4++ = LUT[(ip_4.queue >> ip_4.pos_byte) & PREFIX_LUT_MASK].val;
        ip_4.pos_byte += LUT[(ip_4.queue >> ip_4.pos_byte) & PREFIX_LUT_MASK]
.size;
        *op_4++ = LUT[(ip_4.queue >> ip_4.pos_byte) & PREFIX_LUT_MASK].val;
        ip_4.pos_byte += LUT[(ip_4.queue >> ip_4.pos_byte) & PREFIX_LUT_MASK]
.size;
```

```
  *op_4++ = LUT[(ip_4.queue >> ip_4.pos_byte) & PREFIX_LUT_MASK].val;
  ip_4.pos_byte += LUT[(ip_4.queue >> ip_4.pos_byte) & PREFIX_LUT_MASK]
.size;
   }
```

Static Tree Decoding

The process of decoding literals encoded with a static tree can be faster than decoding literals encoded with a custom tree, since a LUT is not generated. In some embodiments, headers containing static trees also contain precomputed look-up tables for decoding. The decoding process can proceed in a manner similar to that of a custom prefix, with the exception that a memcpy( ) is performed, of the precomputed table to a buffer.

Bubble-Up Decoding

In some embodiments, decoding literals encoded using bubble up encoding includes performing additional steps beyond what is performed for either of custom tree or encoding static tree encoding. For example, both ordered prefix lengths may first be copied from the sorted array using the index of the static tree saved in the header. Next, the inverted index array is reconstructed using the same function init_bubble_table( ) that was used during encoding. After each symbol has been decoded, a rank of that symbol is updated so it will reflect the bubble up rank increase. While the encode_bubble( ) function is used during encoding, during decoding a function decode_bubble( ) reverses the encoding and retrieves each original symbol from the table. The following example code can be used to implement the decode_bubble( ) function:

```
static    void    STEALTH_INLINE    decode_bubble
   (stealth_codec*stealth,
   stealth_buffer*ip,   unsigned   char*op,   const
      prefix_decoder*tree) {
   uint32_t tmp=((ip→queue>>ip→pos_byte));
   const prefix_decoder cmp_1=tree[tmp & ((1<<11)−1)];
   uint8_t comp_val=cmp_1.val>0? 1:0;
   ip→pos_byte+=cmp_1.size;
   op[0]=stealth→rank_table[cmp_1.val];
   uint8_t temp=stealth→rank_table[cmp_1.val];
   stealth→rank_table[cmp_1.val]=stealth→rank_table
      [cmp_1.val−comp_val];
   stealth→rank_table[cmp_1.val·comp_val]=temp;
}
```

Triad Decoding

Length & Number of Literals Decoding

In some embodiments, a number of literals and/or a length of a match can be encoded using a static tree or a custom prefix that, in turn, is saved in the header. A primary difference between custom prefixes for literals and custom prefixes for triad fields is that custom prefixes for triad fields have a dynamic size, since only elements up to a last non-zero element in the triad arrays are saved. There may also be extra values that do not fit in the original range. These extra values are encoded as "extras." The number of extras and their respecting encoding, if any, can be saved after the encoded literal buffer.

Similarly, as in decoding literals, a first step, in the case of a custom prefix, is reconstructing the prefix_encoder array, and subsequently reconstructing the look-up table. In the case of static trees, the look up tables are available to copy from the stealth_triad_trees.h header, and as such, the LUT reconstruction step is skipped, resulting in a speed advantage for the static tree approach. If a file is sufficiently large, the decoding look-up tables can also be reused, thereby further speeding up the decoding.

In some embodiments, triads are decoded using Out-of-Order execution. The triad block sizes saved during the triad encoding process are read from the header to establish the starting points for each stream. The triad elements are decoded separately, in a manner similar to the manner in which they were encoded, in blocks having a size that is determined by the constant TRIAD_BLOCK_SIZE. Such an approach offers the advantage of using only stack memory on decoding triads. An example main decoding loop includes the following four steps:

Decoding the length—similar to decoding literals from a literal buffer, length is decoded using a LZ length lookup table.

Decoding the number of literals—similar to decoding length

Decoding offsets (described below)—using LIE ranges obtained using functions described in the following section, the offsets are decoded by reading their headers and their values, and rebuilding the offsets Rebuilding buffer using decoded blocks of length, number of literals and offsets—involves copying the match and the literals that were not part of the match using values of match length, number of literals, and match offset.

Each block is decoded with an unrolled loop, utilizing Out of Order optimization, in a manner similar to that of decoding literals. For files encoded using a dictionary, another version of the function decode_triads( ) can be used that includes copying matches from the dictionary.

Offset Decoding

Offset is a special case, as it covers wide ranges of numbers. As such, in some embodiments, offset is encoded and decoded using LIE. For example, a function read_unlinear_table( ) first reads the table from the header. Next, a function rebuild_ranges_unlinear_table( ) recreates the look up table using LIE (see Triad Encoding).

Prefix Dictionaries

Since Lempel-Ziv parsing operates by finding and mapping redundant byte sequences, looking backward in the bitstream, compression performance is directly correlated to input data size. In other words, compressing a small file (i.e., 4 KB) will be substantially more difficult than compressing a larger (i.e., 64 KB) file. This behavior can be explained by the fact that smaller files has a smaller history to find matches, and are therefore by nature less redundant. To account for this, the use of prefix dictionaries has long been explored in data compression. Prefix dictionaries contain data which is statistically likely to occur in the data to be compressed, allowing the LZ parser to find matches with the dictionary, and significantly improving compression performance in small data applications.

While the use of prefix dictionaries is well-established, these dictionaries have inherent flaws. Since all data is different, there is no such thing as a "universal" dictionary. For instance, a dictionary built on English text will not be of any use when compression Chinese text. To remedy this issue, independent dictionaries must be constructed on a variety of data. The present application demonstrates a method to do this, and to effectively automatically select the most optimal dictionary for the given data to be compressed.
Dictionary Builder In some embodiments, an encoder includes or is configured to interact with a dictionary builder (implemented in software and/or hardware), which can create/generate a prefix dictionary from a source file. The dictionary builder can generate a prefix dictionary, for example, by dividing the source file into sample and test buffers. The sample buffer is hashed, and possible prefixes for each hash value are saved in a hash table creating context for choosing segments. Next, for each context the sample buffer is divided into epochs of size depending on size of the segment chosen. A segment is chosen from each epoch according to its score, which is a sum of frequencies of the prefixes included in the segment. After a segment with the highest score is chosen from an epoch, its frequencies are zeroed to reduce redundancy. A temporary dictionary is built from the chosen segments, and then it is tested by using it to encode test buffers. Subsequently, the segments array is sorted, and new dictionary built from sorted segments is also tested with encoding. The best dictionary (i.e., the one which achieves the lowest compression ratio on the test buffer) is picked as a final dictionary.

In some embodiments, once the best prefix dictionary has been picked, the dictionary builder saves the prefix dictionary to an output file, for example in a literal array format (e.g., "{0, 23, 1, . . . ,}"). In picking the segments redundancy is avoided by stripping both the head and the tail of the best segment in an epoch from zero frequency prefixes.
Example Functions of the Dictionary Builder Split_into_Sample_and_Test( )

The split_into_sample_and_test( ) function uses a reservoir sampling method to generate a random sample from the input. First, the split_into_sample_and_test( ) function generates a random set of indexes using the sample_indexes array and the variables blocks_number and blocks_to_pick that depend on the size of input file. After picking the required blocks, the sample_indexes array is sorted. The split_into_sample_and_test( ) function copies the blocks from the input file into the test or sample buffer using the indexes saved in sample_indexes. The following example code can be used to implement the split_into_sample_and_test( ) function:

```
uint16_t sample_indexes[HAS_TABLE_SIZE] = { 0 };
  struct _timeb tstruct;
  _ftime_s(&struct);
  unsigned short millisex = tstruct.millitm;
  srand(millisec);
  uint16_t blocks_to_pick = train_buffers->sample_zie / MAX_EPOCH_SIZE;
  uint16_t index = 0;
  whilte (blocks_to_pick) {
     index = rand( ) % blocks_number + 1;
     uint16_t hash = has8B((uint64_t)index);
     if (!sample_indexes[has]) {
        sample_indexes[has] = index;
        blocks_to_pick--;
     }
  }
  qsort(sample_indexes, HAS_TABLE_SIZE, sizeof(uint16_t), compare_indexes_asc);
  uint16_t sample_indez = 0;
  while (sample_indexes[sample_index] == 0) sample_index++;
  uint32_t global_index = 0;
  while (global_index < blocks_numbers) {
     if (global_index == sample_indexes[sample_index] - 1) {
        memcpy(sample_pointer, buffer, MAX_EPOCH_SIZE);
        sample_pointer += MAX_EPOCH_SIZE;
        sample_index++;
     }
     else {
        memcpy(test_pointer, buffer, MAX_EPOCH_SIZE};
        test_pointer += MAX_EPOCH_SIZE;
     }
```

Create_Context ( )

The create_context( ) function can be used for creating a hash table for a given prefix size, by iterating through the sample buffer. The create_context( ) function can read prefix size of bytes (4, 6, or 8), hash the bytes into a 2-byte value, then save the prefix as a 64-bit value if it was seen for the first time or add to its count, using the hash as an index.

Add_to_Seen_Hashes( )

The add_to_seen_hashes( ) function receives a hash value, and the prefix value. As the size of the sample is usually large (i.e. >5 MB), the hashing process can generate a lot of hash collisions. Therefore, the hash table uses the hash as an index for a struct that saves a number (e.g., 160) of different prefix values along with their respective counts. If a particular prefix has not been previously seen its value is appended to the prefixes table for the given hash value. Otherwise its count is simply incremented.

Pick_Best_Segment( )

The pick_best_segment( ) function finds the best segment within an epoch using a copy of the hash table seen_hashes generated by the create_context( ) function. The copy of the hash table is used so the original table can be reused on different segment size. The pick_best_segment( ) function first creates table of scores for each prefix in the epoch. It calculates then score for each segment using rolling score method (i.e., utilizing the fact that the consecutive segments differ only by the first and last prefixes) and as a result the score of the next segment is the score of the previous segment minus its first prefix score and plus the next prefix score. Once the best segment is found, both its beginning and the end are stripped from the prefixes that have zero frequencies. The following example of the code might be used to implement picking the segment from the epoch:

```
uint32_t index=0;
uint32_t end=epoch_size-dmer_size-1;
uint32_t current_score=new_segment.score;
uint8_t*seg_begin=sample_pointer;
uint16_t seg_start_index=0;
while (index+segment_size<end) {
    uint32_t deduct_score=scores_table[index].score;
    uint32_t next_score=scores_table[index+segment_size].score;
    current_score=current_score-deduct_score+
        next_score;
    seg_begin++;
    index++;
    if (current_score>new_segment.score) {
        new_segment.score=current_score;
        new_segment.position=seg_begin-sample_begin;
        seg_start_index=index;
    }
}
```

Save_Temp_Dictionary( )

The save_temp_dictionary( ) function can be used to generate a temporary prefix dictionary by adding the segments saved in segments table. The function save_temp_dictionary( ) adds the segments up to dictionary size starting from the end of the dictionary buffer, so the most likely matches can get the smallest offset values (i.e., located closest to the buffer used for future data compression). Once the prefix dictionary has been generated, it is then tested using test_dict( ) function to assess its efficiency.

Test_Dict( )

The test_dict( ) function can be used to test the temporary dictionary to assess its efficiency measured by the compression ratio achieved. It uses the test buffer and stealth functions such as stealth_encode( ) to get the compressed file size. In order to amplify the differences between temporary dictionaries it splits the test buffer into 4 KB chunks, as the chunks of this size are most affected by the dictionary efficiency. The test_dict( ) function can return the total compressed size for all the chunks which enables comparison between different dictionaries.

Train_Dictionary( )

The train_dictionary( ) function uses function create_dictionary( ), save_temp_dictionary( ) and test_dict( ) to find the dictionary that achieves the most efficient compression measured by the size of compressed test buffer. The dictionary is then copied to dictionary_buffer.

Additional details pertaining to dictionary construction can be found in U.S. patent application Ser. No. 16/806,338, filed Mar. 2, 2020 and titled "System and Method for Statistics-Based Pattern Searching of Compressed Data and Encrypted Data," the entire contents of which are incorporated by reference herein for all purposes.

Dictionary Selection

With a library of prefix dictionaries constructed, methods for selecting the appropriate or adequate dictionary for each compression scenario are desired. Such methods are described herein.

Example Dictionary-Related Functions

Select_Dictionary( )

The function select_dictionary( ) receives a chunk of data to be compressed, identifies and selects the most appropriate dictionary by choosing a sample from the input of the size depending on input size (e.g., 1024 bytes for 4 KB input). The sample blocks are chosen pseudo-randomly.

The frequencies of characters in the sample blocks are then counted, and the cross-entropy of the sample is compared with that of prefix dictionaries to find the lowest value. The cross-entropy is calculated similarly to cross-entropy for finding a static tree for encoding byte literals. To simplify the calculations the value of file size is used for comparison as it can avoid unnecessary division. The following example of the code might be used to implement dictionary selection:

```
for (int i = index; i < MAX_SAMPLE_SIZE * 4; i++) {
    uint8_t* block_begin = buf_in + (uint64_t)(sample_indexes[i] - 1) * 1024;
    uint16_t end = 1024;
    if (size < 1024) {
        end = size;
    }
    for (int j = 0; j < end; j++) {
        uint8_t new_char = block_begin[j];
        freqs[new_char]++;
    }
}
uint64_t file_sizes[8] = { 0 };
uint64_t best_size = 0xFFFFFFFF;
uint8_t best_index = 0;
for (int i = 0; i < 8; i++) {
    file_sizes[i] = calculate_file_size(dict_trees[i], freqs, ALPHABET_SIZE);
    if (file_sizes[i] < best_size) {
        best_index = i;
        best_size = file_sizes[i];
    }
}
return best_indez + 1;
```

The prefix trees for dictionaries can be built from the dictionaries saved as separate flat files during the dictionary header generation. As the dictionaries are relatively small in size these prefix trees can provide accurate calculations of similarity between the input file and the dictionaries.

Load_Dictionary( )

The Load_dictionary( ) function is a function that receives, as an argument, a dictionary number, and loads the appropriate dictionary and its size into the stealth codec struct.

Additional details regarding compression and decompression techniques can be found in U.S. Pat. No. 10,491,240, titled "Systems and Methods for Variable Length Codeword Based, Hybrid Data Encoding and Decoding Using Dynamic Memory Allocation," and in U.S. patent application Ser. No. 16/274,417, titled "Systems and Methods for Variable Length Codeword Based Data Encoding and Decoding Using Dynamic Memory Allocation," the entire contents of each of which are incorporated by reference herein in their entireties.

Figure 6:
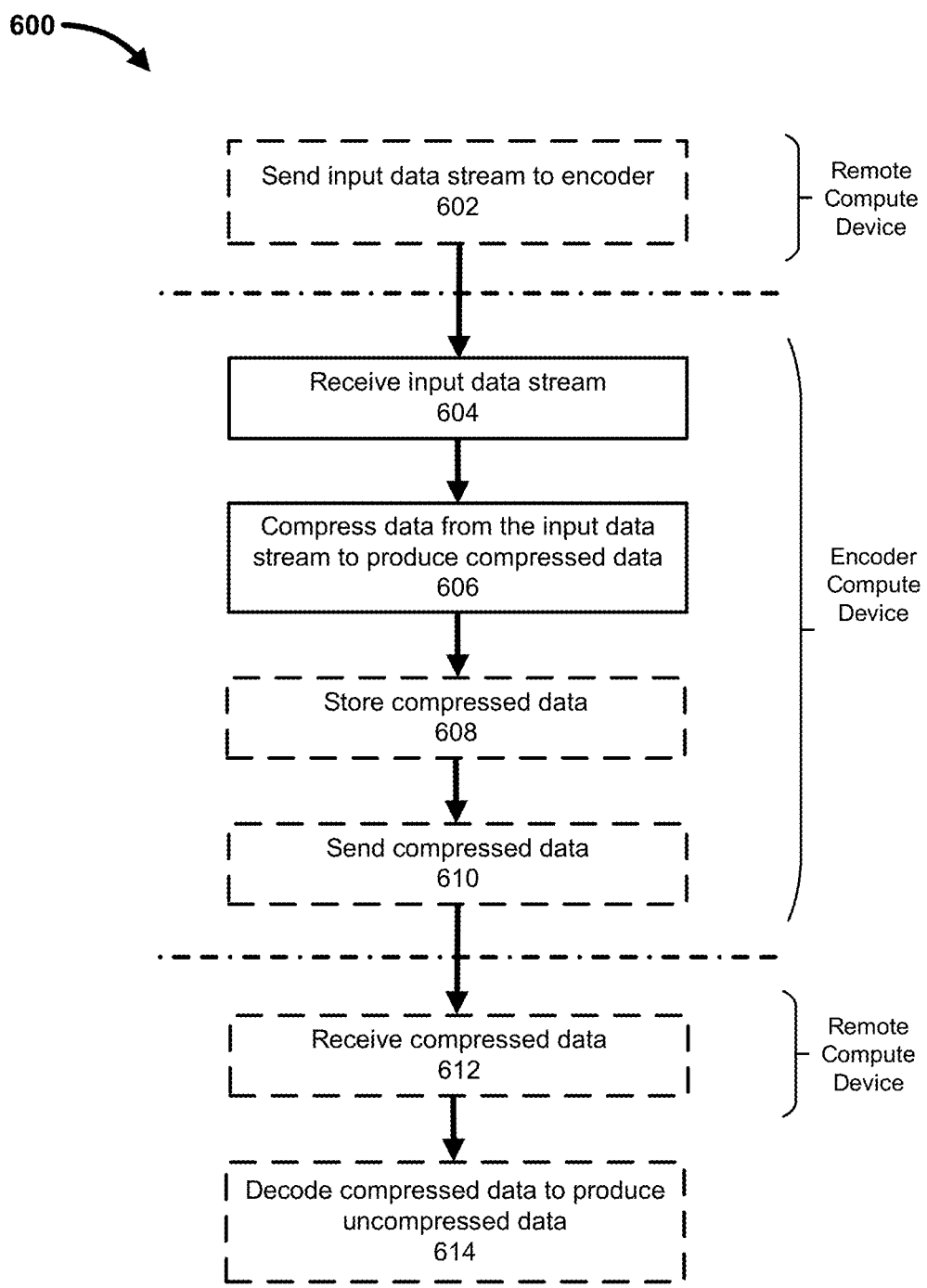
FIG. 6 is a flowchart showing an example method for encoding and decoding data, according to some embodiments.

FIG. 6 is a flowchart showing an example method 600 for encoding and decoding data, according to some embodiments. As shown in FIG. 6, the method 600 optionally includes sending an input data stream, at 602, from a remote compute device (e.g., the one or more compute devices 530 of FIG. 5) to an encoder compute device (e.g., the encoder compute device 510 of FIG. 5). At 604, the encoder compute device receives the input data stream, and compresses data from the input data stream, at 606, to produce compressed data. The compression at 606 can be performed according to a predefined or desired compression level that can be stored in a memory of the encoder compute device and optionally customized by a user and/or sent to the encoder compute device from the remote compute device. The compression at 606 can include one or more of LZ modeling, SPM, DPM, TPM, Byte Literal Encoding, Cross-Entropy Heuristic(s), PCA Heuristic(s), Custom Huffman Tree(s), Bubble Up Encoding, Triad Encoding, Large Integer Encoding, Large Integer Tree Encoding, Large Integer Frequency Counting, Repeated Large Integer Encoding, Triad Encoding in Blocks, a dictionary builder, dictionary selection, a simple API (including any of the supported functions set forth herein), an advanced API (including any of the supported functions set forth herein), or any of the methods shown in FIGS. 1-3, each of which is discussed in detail above. The encoder optionally stores the compressed data at 608. The encoder compute device also optionally sends a signal including a representation of the compressed data, at 610, back to the remote compute device. At 612, the remote compute device optionally receives the signal including the representation of the compressed data, and optionally decodes the compressed data, at 614, to produce uncompressed data. The decoding of the compressed data at 614 can include one or more of Byte Literal Decoding, Custom Tree Decoding, Status Tree Decoding, Bubble-Up Decoding, Triad Decoding, Length & Number of Literals Decoding, Offset Decoding, a dictionary builder, dictionary selection, a simple API (including any of the supported functions set forth herein), or an advanced API (including any of the supported functions set forth herein), each of which is discussed in detail above. The selection of a decoding technique can be based on a type of encoding of the compressed data (e.g., as indicated by the header of the compressed data).

Figure 7:
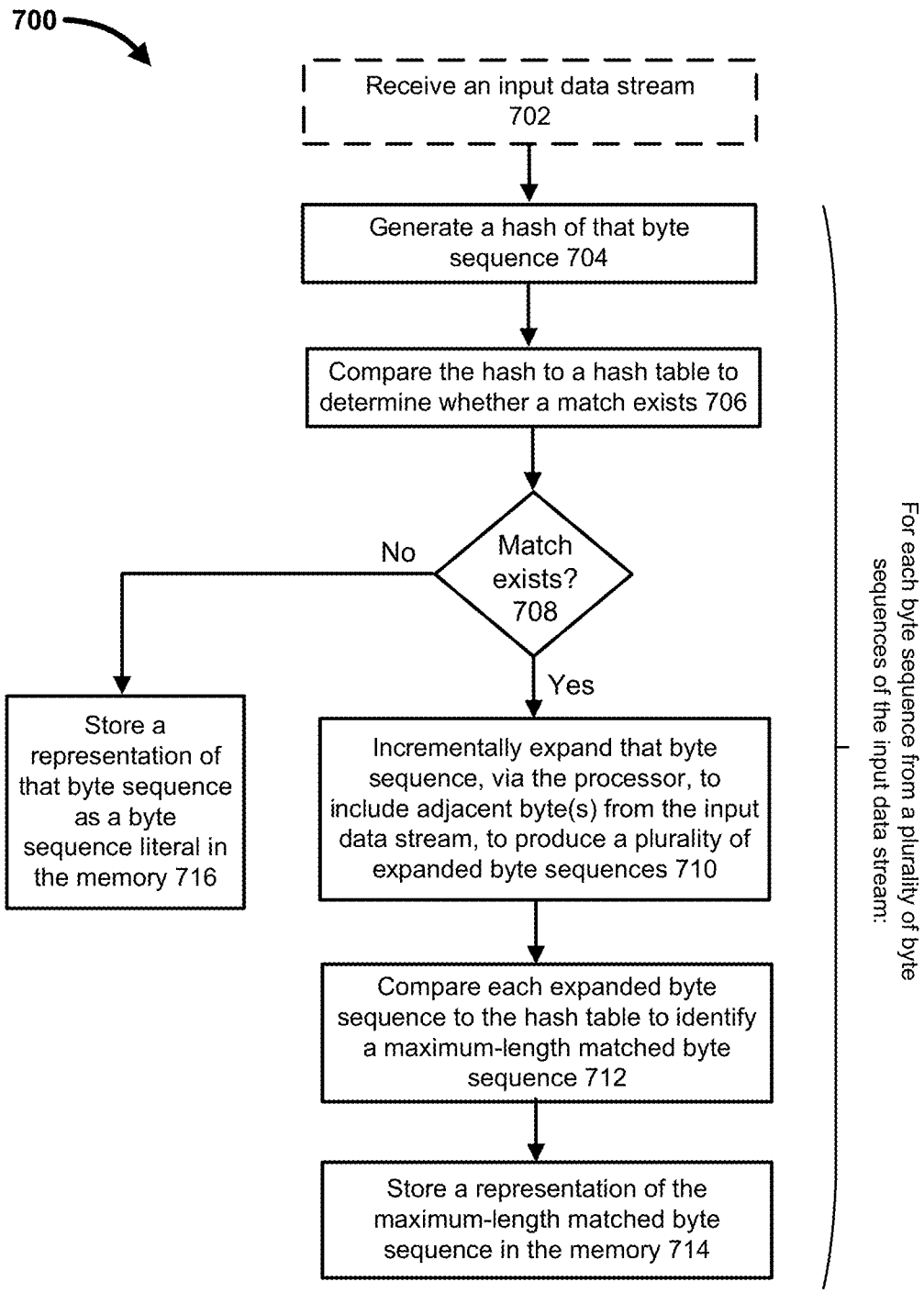
FIG. 7 is a flow diagram showing a method for single-pass modelling, according to some embodiments.

FIG. 7 is a flow diagram showing a method for single-pass modelling, according to some embodiments. As shown in FIG. 7, the method 700 optionally includes receiving, at 702, an input data stream at a processor. For each byte sequence from a plurality of byte sequences of the input data stream, a hash of that byte sequence is generated by the processor at 704. The hash is compared, at 706 and via the processor, to a hash table to determine whether a match exists (708). The hash table is stored in a memory operably coupled to the processor. If a match exists at 708, that byte sequence is incrementally expanded, at 710 and via the processor, to include one or more additional adjacent bytes from the input data stream, to produce a plurality of expanded byte sequences. Each expanded byte sequence from the plurality of expanded byte sequences is compared, at 712 and via the processor, to the hash table to identify a maximum-length matched byte sequence from a set that includes the byte sequence and the plurality of expanded byte sequences, and a representation of the maximum-length matched byte sequence is stored in the memory at 714. If a match does not exist at 708, a representation of that byte sequence is stored as a byte sequence literal in the memory at 716.

In some implementations, the memory stores a plurality of maximum-length matched byte sequences including the maximum-length matched byte sequence, and the memory stores a plurality of byte sequence literals including the byte sequence literal. The method can also include encoding data based on the plurality of maximum-length matched byte sequences and the plurality of byte sequence literals.

In some implementations, the one or more additional adjacent bytes from the input data stream occur subsequent that byte sequence within the input data stream, such that the incrementally expanding each byte sequence includes adding a subsequent one or more additional adjacent bytes from the input data stream to that byte sequence.

In some implementations, the one or more additional adjacent bytes from the input data stream occur prior to that byte sequence within the input data stream, such that the incrementally expanding each byte sequence includes adding a preceding one or more additional adjacent bytes from the input data stream to that byte sequence.

In some implementations, the one or more additional adjacent bytes from the input data stream are a plurality of additional adjacent bytes, the plurality of additional adjacent bytes including at least one bit occurring prior to that byte sequence within the input data stream and at least one bit occurring subsequent to that byte sequence within the input data stream, such that the incrementally expanding each byte sequence includes adding at least one preceding bit and at least one subsequent bit from the input data stream to that byte sequence.

In some implementations, the generating the hash of each byte sequence from the plurality of byte sequences of the input data stream is performed concurrently. The comparing the hash of each byte sequence from the plurality of byte sequences of the input data stream to the hash table to determine whether a match exists can be performed sequentially.

In some implementations, the representation of the maximum-length matched byte sequence is a triad that includes a representation of a length of the maximum-length matched byte sequence, an offset between the maximum-length matched byte sequence and a current byte sequence, and a number of byte literals between the maximum-length matched byte sequence and a previous match associated with the input data stream.

In some implementations, the comparing the hash of each byte sequence from the plurality of byte sequences of the input data stream to the hash table to determine whether a match exists is performed in response to detecting that that hash has a length that is greater than a minimum match size.

In some embodiments, a system includes a processor and a memory that is operably coupled to the processor and that stores instructions that, when executed by the processor, cause the processor to perform a method. The method includes, for each byte sequence from a plurality of byte sequences of an input data stream, generating a hash of that byte sequence and comparing the hash to a hash table to determine whether a match exists. The hash table is stored in a memory operably coupled to the processor. If a match exists, that byte sequence is incrementally expanded to include one or more additional adjacent bytes from the input data stream, to produce a plurality of expanded byte sequences. Each expanded byte sequence from the plurality of expanded byte sequences is compared to the hash table to identify a maximum-length matched byte sequence from a set that includes the byte sequence and the plurality of expanded byte sequences. A representation of the maximum-length matched byte sequence is stored in the memory. If a match does not exist, a representation of that byte sequence is stored as a byte sequence literal in the memory.

In some embodiments, a non-transitory, processor-readable medium stores instructions to perform a method. The method includes, for each byte sequence from a plurality of byte sequences of an input data stream, generating a hash of that byte sequence and comparing the hash to a hash table to determine whether a match exists. The hash table is stored in a memory operably coupled to the processor. If a match exists, that byte sequence is incrementally expanded to include one or more additional adjacent bytes from the input data stream, to produce a plurality of expanded byte sequences. Each expanded byte sequence from the plurality of expanded byte sequences is compared to the hash table to identify a maximum-length matched byte sequence from a set that includes the byte sequence and the plurality of expanded byte sequences. A representation of the maximum-length matched byte sequence is caused to be stored in the memory. If a match does not exist, a representation of that byte sequence as a byte sequence literal is caused to be stored in the memory.

Figure 8:
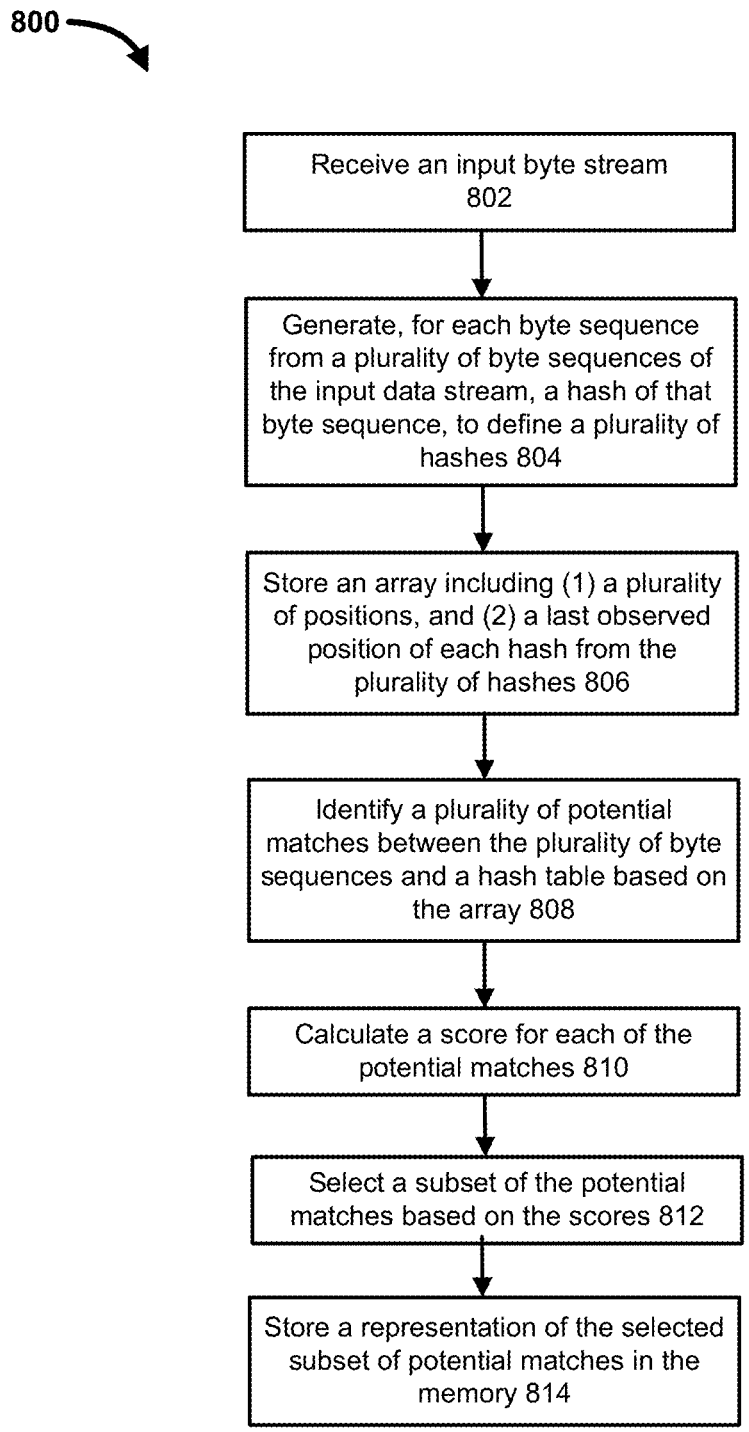
FIG. 8 is a flow diagram showing a method for double-pass modelling, according to some embodiments.

FIG. 8 is a flow diagram showing a method for double-pass modelling, according to some embodiments. As shown in FIG. 8, the method 800 includes receiving, at 802 and a processor, an input bit stream, and generating, at 804, via the processor and for each byte sequence from a plurality of byte sequences of the input data stream, a hash of that byte sequence, to define a plurality of hashes. The method 800 also includes storing, at 806, in a memory operably coupled to the processor, an array that includes (1) a plurality of positions, each position from the plurality of positions being a position within the input data stream of a hash from the plurality of hashes, and (2) a last observed position of each hash from the plurality of hashes. The method also includes identifying, at 808, via the processor, a plurality of potential matches between the plurality of byte sequences and a hash table based on the array, and calculating a score at 810, from a plurality of scores, for each potential match from the plurality of potential matches. A subset of potential matches is selected at 812 from the plurality of potential matches, based on the plurality of scores, and a representation of the selected subset of potential matches is stored in the memory at 814.

In some implementations, a size of the array is equal to a size of the input bit stream.

In some implementations, the identifying the plurality of potential matches includes performing a predefined number of searches of the array.

In some implementations, the predefined number of searches is based on a predefined parsing quality.

In some implementations, the memory is a first memory and the plurality of byte sequences is a first plurality of byte sequences, the method further comprising storing, in a second memory different from the first memory, a representation of a second plurality of byte sequences that has not been matched to the hash table.

In some implementations, the identifying the plurality of potential matches is performed without reference to the input data stream.

In some implementations, the input data stream is an input bit stream.

In some implementations, the identifying the plurality of potential matches includes iteratively incrementing at least one position from the plurality of positions.

In some embodiments, a system includes a processor and a memory, operably coupled to the processor and storing instructions that, when executed by the processor, cause the processor to perform a method. The method includes generating, for each byte sequence from a plurality of byte sequences of the input data stream, a hash of that byte sequence, to define a plurality of hashes. The method also includes storing, in the memory, an array that includes (1) a plurality of positions, each position from the plurality of positions being a position within the input data stream of a hash from the plurality of hashes, and (2) a last observed position of each hash from the plurality of hashes. The method also includes identifying a plurality of potential matches between the plurality of byte sequences and a hash table based on the array, and calculating a score, from a plurality of scores, for each potential match from the plurality of potential matches. The method also includes selecting a subset of potential matches from the plurality of potential matches, based on the plurality of scores, and storing a representation of the selected subset of potential matches in the memory.

Figure 9A:
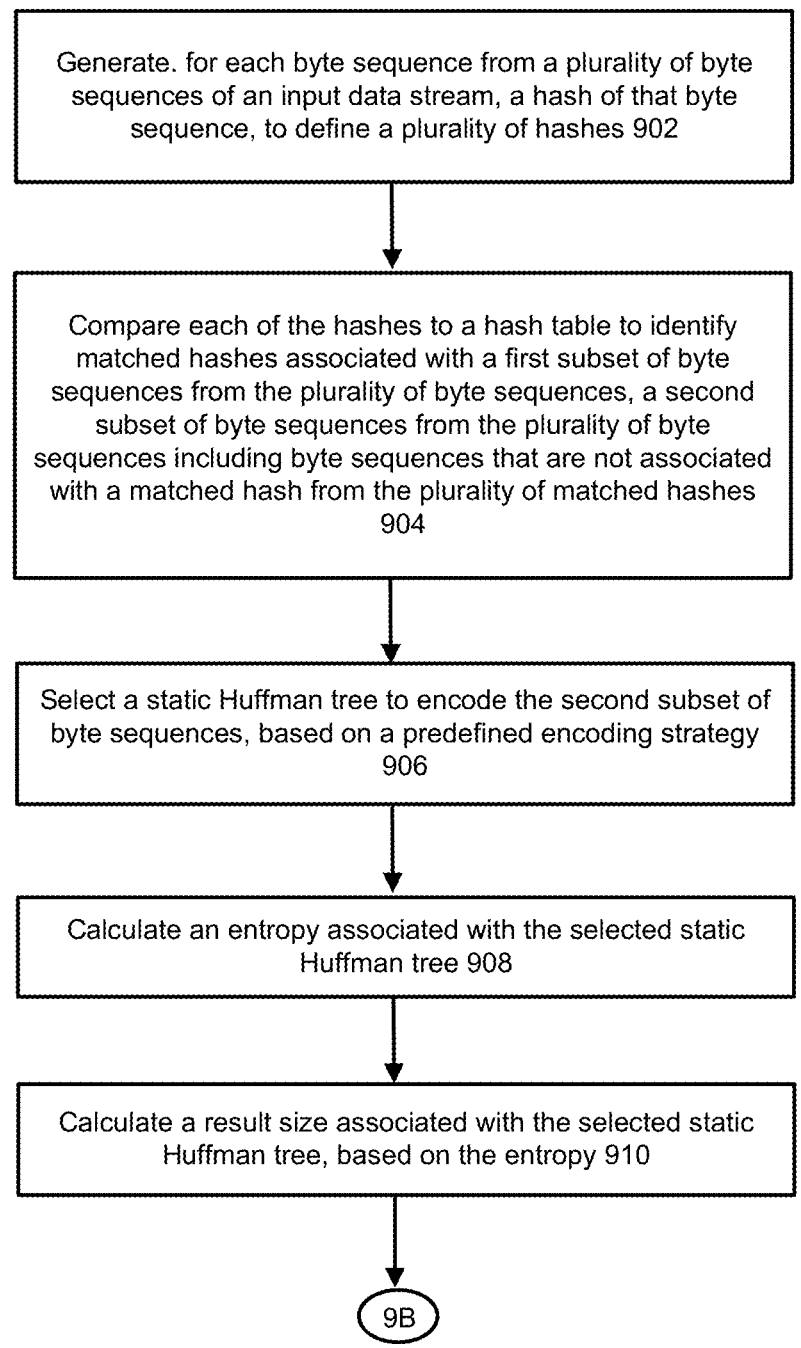
FIGS. 9A-9B are a flow diagram showing a method for triple-pass modelling, according to some embodiments.
Figure 9B:
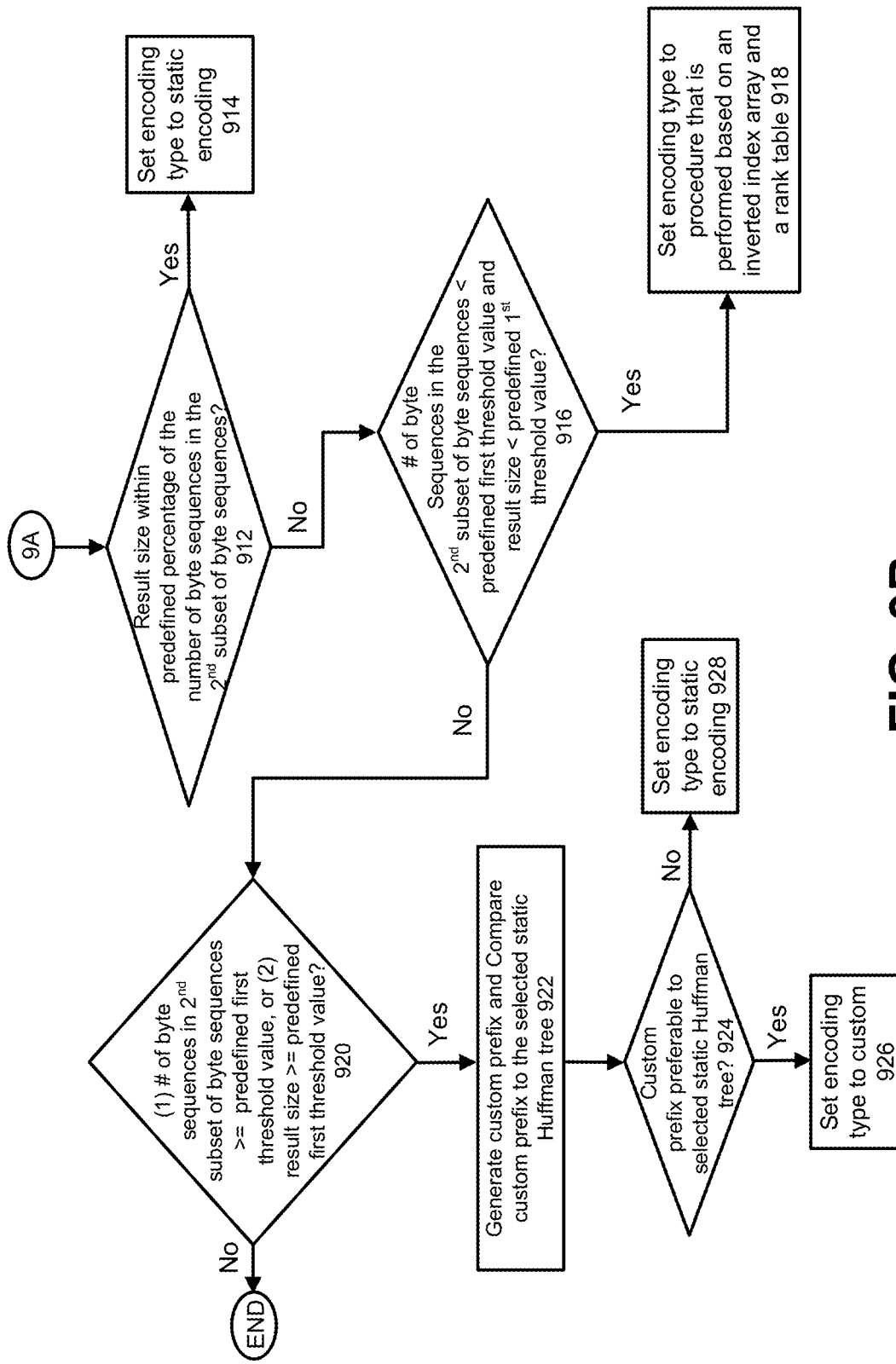

FIGS. 9A-9B are a flow diagram showing a method for triple-pass modelling, according to some embodiments. As shown in FIG. 9A, the method 900 includes generating, at 902, via a processor and for each byte sequence from a plurality of byte sequences of an input data stream, a hash of that byte sequence, to define a plurality of hashes. The method 900 also includes comparing each hash from the plurality of hashes to a hash table, at 904, to identify a plurality of matched hashes associated with a first subset of byte sequences from the plurality of byte sequences, a second subset of byte sequences from the plurality of byte sequences including byte sequences that are not associated with a matched hash from the plurality of matched hashes. The method 900 also includes selecting a static Huffman tree at 906, to encode the second subset of byte sequences, based on a predefined encoding strategy, and calculating an entropy associated with the selected static Huffman tree at 908. The method 900 also includes calculating a result size associated with the selected static Huffman tree, at 910, based on the entropy, and determining whether the result size is within a predefined percentage of a number of byte sequences in the second subset of byte sequences at 912 (continuing the method 900 from FIG. 9A to FIG. 9B). If the result size at 912 is within the predefined percentage of the number of byte sequences in the second subset of byte sequences, an encoding type is set to static encoding at 914. If the result size at 912 is not within the predefined percentage of the number of byte sequences in the second subset of byte sequences, and at 916 the number of byte sequences in the second subset of byte sequences is less than a predefined first threshold value, and the result size is less than the predefined first threshold value, the encoding type is set, at 918, to an encoding procedure that is performed based on an inverted index array and a rank table. If the result size is not within the predefined percentage of the number of byte sequences in the second subset of byte sequences, and if at 920 at least one of: (1) the number of byte sequences in the second subset of byte sequences is not less than the predefined first threshold value, or (2) the result size is not less than the predefined first threshold value, a custom prefix is generated and compared to the selected static Huffman tree at 922. If the custom prefix is preferable to the selected static Huffman tree at 924, the encoding type is set to custom at 926, and if the custom prefix is not preferable to the selected static Huffman tree at 924, the encoding type is set to static encoding at 928. If at 920 it is not true that at least one of: (1) the number of byte sequences in the second subset of byte sequences is not less than the predefined first threshold value, or (2) the result size is not less than the predefined first threshold value, the method 900 ends.

In some implementations, the method also includes encoding the second subset of byte sequences based using an encoder having the encoding type.

In some implementations, the method also includes selecting the predefined encoding strategy based on a frequency of occurrence of each character from a plurality of characters of the second subset of byte sequences. Optionally, the method also includes determining the frequency of occurrence of each character from a plurality of characters of the second subset of byte sequences using an unrolled loop.

In some implementations, the selecting the static Huffman tree is performed using principal components analysis (PCA). The predefined encoding strategy can be to prioritize speed of compression.

In some implementations, the selecting the static Huffman tree is performed using a cross-entropy heuristic.

In some implementations, the predefined encoding strategy is to prioritize accuracy over speed of compression.

Figure 10:
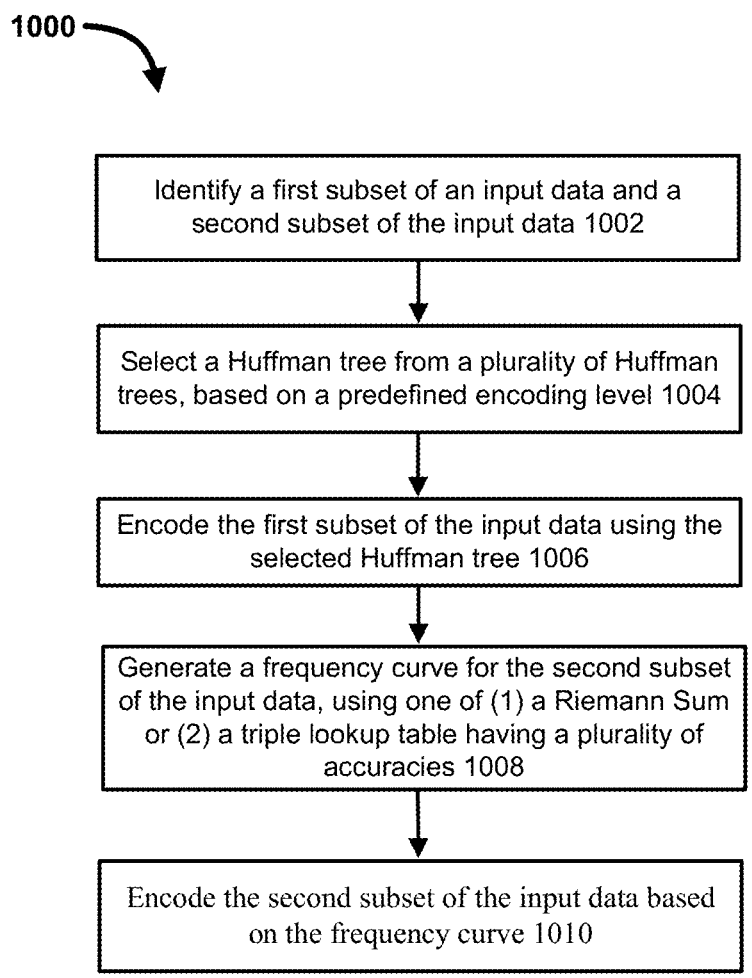
FIG. 10 is a flow diagram showing a method for triad encoding with Large Integer Encoding (LIE), according to some embodiments.

FIG. 10 is a flow diagram showing a method 100 for triad encoding with Large Integer Encoding (LIE), according to some embodiments. As shown in FIG. 10, the method 1000 includes identifying, at 1002 and via a processor, a first subset of an input data and a second subset of the input data. A Huffman tree is selected, at 1004, via the processor and from a plurality of Huffman trees, based on a predefined encoding level, and the first subset of the input data is encoded at 1006 using the selected Huffman tree. A frequency curve is generated at 1008 for the second subset of the input data, using one of (1) a Riemann Sum or (2) a triple lookup table having a plurality of accuracies, and the second subset of the input data is encoded based on the frequency curve at 1010.

All combinations of the foregoing concepts and additional concepts discussed here (provided such concepts are not mutually inconsistent) are contemplated as being part of the subject matter disclosed herein. The terminology explicitly employed herein that also may appear in any disclosure incorporated by reference should be accorded a meaning most consistent with the particular concepts disclosed herein.

The skilled artisan will understand that the drawings primarily are for illustrative purposes, and are not intended to limit the scope of the subject matter described herein. The drawings are not necessarily to scale; in some instances, various aspects of the subject matter disclosed herein may be shown exaggerated or enlarged in the drawings to facilitate an understanding of different features. In the drawings, like reference characters generally refer to like features (e.g., functionally similar and/or structurally similar elements).

To address various issues and advance the art, the entirety of this application (including the Cover Page, Title, Headings, Background, Summary, Brief Description of the Drawings, Detailed Description, Embodiments, Abstract, Figures, Appendices, and otherwise) shows, by way of illustration, various embodiments in which the embodiments may be practiced. The advantages and features of the application are of a representative sample of embodiments only, and are not exhaustive and/or exclusive. Rather, they are presented to assist in understanding and teach the embodiments, and are not representative of all embodiments. As such, certain aspects of the disclosure have not been discussed herein. That alternate embodiments may not have been presented for a specific portion of the innovations or that further undescribed alternate embodiments may be available for a portion is not to be considered to exclude such alternate embodiments from the scope of the disclosure. It will be appreciated that many of those undescribed embodiments incorporate the same principles of the innovations and others are equivalent. Thus, it is to be understood that other embodiments may be utilized and functional, logical, operational, organizational, structural and/or topological modifications may be made without departing from the scope and/or spirit of the disclosure. As such, all examples and/or embodiments are deemed to be non-limiting throughout this disclosure.

Also, no inference should be drawn regarding those embodiments discussed herein relative to those not discussed herein other than it is as such for purposes of reducing space and repetition. For instance, it is to be understood that the logical and/or topological structure of any combination of any program components (a component collection), other components and/or any present feature sets as described in the figures and/or throughout are not limited to a fixed operating order and/or arrangement, but rather, any disclosed order is exemplary and all equivalents, regardless of order, are contemplated by the disclosure.

Various concepts may be embodied as one or more methods, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Put differently, it is to be understood that such features may not necessarily be limited to a particular order of execution, but rather, any number of threads, processes, services, servers, and/or the like that may execute serially, asynchronously, concurrently, in parallel, simultaneously, synchronously, and/or the like in a manner consistent with the disclosure. As such, some of these features may be mutually contradictory, in that they cannot be simultaneously present in a single embodiment. Similarly, some features are applicable to one aspect of the innovations, and inapplicable to others.

In addition, the disclosure may include other innovations not presently described. Applicant reserves all rights in such innovations, including the right to embodiment such innovations, file additional applications, continuations, continuations-in-part, divisional s, and/or the like thereof. As such, it should be understood that advantages, embodiments, examples, functional, features, logical, operational, organizational, structural, topological, and/or other aspects of the disclosure are not to be considered limitations on the disclosure as defined by the embodiments or limitations on equivalents to the embodiments. Depending on the particular desires and/or characteristics of an individual and/or enterprise user, database configuration and/or relational model, data type, data transmission and/or network framework, syntax structure, and/or the like, various embodiments of the technology disclosed herein may be implemented in a manner that enables a great deal of flexibility and customization as described herein.

All definitions, as defined and used herein, should be understood to control over dictionary definitions, definitions in documents incorporated by reference, and/or ordinary meanings of the defined terms.

As used herein, in particular embodiments, the terms "about" or "approximately" when preceding a numerical value indicates the value plus or minus a range of 10%. Where a range of values is provided, it is understood that each intervening value, to the tenth of the unit of the lower limit unless the context clearly dictates otherwise, between the upper and lower limit of that range and any other stated or intervening value in that stated range is encompassed within the disclosure. That the upper and lower limits of these smaller ranges can independently be included in the smaller ranges is also encompassed within the disclosure, subject to any specifically excluded limit in the stated range. Where the stated range includes one or both of the limits, ranges excluding either or both of those included limits are also included in the disclosure.

The indefinite articles "a" and "an," as used herein in the specification and in the embodiments, unless clearly indicated to the contrary, should be understood to mean "at least one."

The phrase "and/or," as used herein in the specification and in the embodiments, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the embodiments, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the embodiments, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the embodiments, shall have its ordinary meaning as used in the field of patent law.

As used herein in the specification and in the embodiments, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the embodiments, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

While specific embodiments of the present disclosure have been outlined above, many alternatives, modifications, and variations will be apparent to those skilled in the art. Accordingly, the embodiments set forth herein are intended to be illustrative, not limiting. Various changes may be made without departing from the spirit and scope of the disclosure.

The invention claimed is:

1. A method, comprising:
   receiving, at a processor, an input data stream;
   for each byte sequence from a plurality of byte sequences of the input data stream:
   generate, via the processor, a hash of that byte sequence;
   compare the hash, via the processor, to a hash table to determine whether a match exists, the hash table stored in a memory operably coupled to the processor;
   if a match exists:
   incrementally expand that byte sequence, via the processor, to include one or more additional adjacent bytes from the input data stream, to produce a plurality of expanded byte sequences,
   compare, via the processor, each expanded byte sequence from the plurality of expanded byte sequences to the hash table to identify a maximum-length matched byte sequence from a set that includes the byte sequence and the plurality of expanded byte sequences, and
   store a representation of the maximum-length matched byte sequence in the memory; and
   if a match does not exist:
   store a representation of that byte sequence as a byte sequence literal in the memory.

2. The method of claim 1, wherein the memory stores a plurality of maximum-length matched byte sequences including the maximum-length matched byte sequence, and the memory stores a plurality of byte sequence literals including the byte sequence literal, the method further comprising encoding data based on the plurality of maximum-length matched byte sequences and the plurality of byte sequence literals.

3. The method of claim 1, wherein the one or more additional adjacent bytes from the input data stream occur subsequent that byte sequence within the input data stream, such that the incrementally expanding each byte sequence includes adding a subsequent one or more additional adjacent bytes from the input data stream to that byte sequence.

4. The method of claim 1, wherein the one or more additional adjacent bytes from the input data stream occur prior to that byte sequence within the input data stream, such that the incrementally expanding each byte sequence includes adding a preceding one or more additional adjacent bytes from the input data stream to that byte sequence.

5. The method of claim 1, wherein the one or more additional adjacent bytes from the input data stream are a plurality of additional adjacent bytes, the plurality of additional adjacent bytes including at least one bit occurring prior to that byte sequence within the input data stream and at least one bit occurring subsequent to that byte sequence within the input data stream, such that the incrementally expanding each byte sequence includes adding at least one preceding bit and at least one subsequent bit from the input data stream to that byte sequence.

6. The method of claim 1, wherein the generating the hash of each byte sequence from the plurality of byte sequences of the input data stream is performed concurrently.

7. The method of claim 6, wherein the comparing the hash of each byte sequence from the plurality of byte sequences of the input data stream to the hash table to determine whether a match exists is performed sequentially.

8. The method of claim 1, wherein the representation of the maximum-length matched byte sequence is a triad that includes a representation of a length of the maximum-length matched byte sequence, an offset between the maximum-length matched byte sequence and a current byte sequence, and a number of byte literals between the maximum-length matched byte sequence and a previous match associated with the input data stream.

9. The method of claim 1, wherein the comparing the hash of each byte sequence from the plurality of byte sequences of the input data stream to the hash table to determine whether a match exists is performed in response to detecting that that hash has a length that is greater than a minimum match size.

10. A method, comprising:
receiving, at a processor, an input bit stream;
generating, via the processor and for each byte sequence from a plurality of byte sequences of the input data stream, a hash of that byte sequence, to define a plurality of hashes;
storing, in a memory operably coupled to the processor, an array that includes (1) a plurality of positions, each position from the plurality of positions being a position within the input data stream of a hash from the plurality of hashes, and (2) a last observed position of each hash from the plurality of hashes;
identifying, via the processor, a plurality of potential matches between the plurality of byte sequences and a hash table based on the array;
calculating a score, from a plurality of scores, for each potential match from the plurality of potential matches;
selecting a subset of potential matches from the plurality of potential matches, based on the plurality of scores; and
storing a representation of the selected subset of potential matches in the memory.

11. The method of claim 10, wherein a size of the array is equal to a size of the input bit stream.

12. The method of claim 10, wherein the identifying the plurality of potential matches includes performing a predefined number of searches of the array.

13. The method of claim 12, wherein the predefined number of searches is based on a predefined parsing quality.

14. The method of claim 10, wherein the memory is a first memory and the plurality of byte sequences is a first plurality of byte sequences, the method further comprising storing, in a second memory different from the first memory, a representation of a second plurality of byte sequences that has not been matched to the hash table.

15. The method of claim 10, wherein the identifying the plurality of potential matches is performed without reference to the input data stream.

16. The method of claim 10, wherein the input data stream is an input bit stream.

17. The method of claim 10, wherein the identifying the plurality of potential matches includes iteratively incrementing at least one position from the plurality of positions.

18. A method, comprising:
generating, via a processor and for each byte sequence from a plurality of byte sequences of an input data stream, a hash of that byte sequence, to define a plurality of hashes;
comparing each hash from the plurality of hashes to a hash table to identify a plurality of matched hashes associated with a first subset of byte sequences from the plurality of byte sequences, a second subset of byte sequences from the plurality of byte sequences including byte sequences that are not associated with a matched hash from the plurality of matched hashes;
selecting a static Huffman tree to encode the second subset of byte sequences, based on a predefined encoding strategy;
calculating an entropy associated with the selected static Huffman tree;
calculating a result size associated with the selected static Huffman tree, based on the entropy;
determining whether the result size is within a predefined percentage of a number of byte sequences in the second subset of byte sequences;
if the result size is within the predefined percentage of the number of byte sequences in the second subset of byte sequences, set an encoding type to static encoding; and
if the result size is not within the predefined percentage of the number of byte sequences in the second subset of byte sequences:
if the number of byte sequences in the second subset of byte sequences is less than a predefined first threshold value and the result size is less than the predefined first threshold value, set the encoding type to an encoding procedure that is performed based on an inverted index array and a rank table;
if at least one of: (1) the number of byte sequences in the second subset of byte sequences is not less than the predefined first threshold value, or (2) the result size is not less than the predefined first threshold value:
generate a custom prefix;
compare the custom prefix to the selected static Huffman tree;
if the custom prefix is preferable to the selected static Huffman tree, set the encoding type to custom; and
if the custom prefix is not preferable to the selected static Huffman tree, set the encoding type to static encoding.

19. The method of claim 18, further comprising encoding the second subset of byte sequences based using an encoder having the encoding type.

20. The method of claim 18, further comprising selecting the predefined encoding strategy based on a frequency of occurrence of each character from a plurality of characters of the second subset of byte sequences.

* * * * *